(12) United States Patent
Kim et al.

(10) Patent No.: US 11,314,007 B2
(45) Date of Patent: Apr. 26, 2022

(54) CIRCULARLY POLARIZING PLATE

(71) Applicant: LG CHEM, LTD., Seoul (KR)

(72) Inventors: Sun Kug Kim, Daejeon (KR); Moon Soo Park, Daejeon (KR); Sin Young Kim, Daejeon (KR); Hyuk Yoon, Daejeon (KR); Eun Soo Huh, Daejeon (KR); Jong Hyun Jung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 36 days.

(21) Appl. No.: 16/629,545

(22) PCT Filed: Jul. 10, 2018

(86) PCT No.: PCT/KR2018/007785
§ 371 (c)(1),
(2) Date: Jan. 8, 2020

(87) PCT Pub. No.: WO2019/013516
PCT Pub. Date: Jan. 17, 2019

(65) Prior Publication Data
US 2021/0011210 A1  Jan. 14, 2021

(30) Foreign Application Priority Data
Jul. 10, 2017  (KR) ........................ 10-2017-0087122

(51) Int. Cl.
*G02B 5/30*  (2006.01)
*C09K 19/34*  (2006.01)
(Continued)

(52) U.S. Cl.
CPC .............. *G02B 5/305* (2013.01); *C09K 19/24* (2013.01); *C09K 19/3497* (2013.01);
(Continued)

(58) Field of Classification Search
CPC .... G02B 5/305; G02B 5/3016; G02B 5/3083; H01L 51/5293; H01L 51/5281;
(Continued)

(56) References Cited

U.S. PATENT DOCUMENTS 7,393,570 B2  7/2008  Takeda et al.
8,059,337 B2  11/2011  Ono
(Continued)

FOREIGN PATENT DOCUMENTS

CN        1993448      7/2007
CN        101331136   12/2008
(Continued)

OTHER PUBLICATIONS

International Search Report and the Written Opinion of PCT/KR2018/007785, dated Oct. 19 2018.

*Primary Examiner* — Ruiyun Zhang
(74) *Attorney, Agent, or Firm* — Dentons US LLP

(57) ABSTRACT

Provided is a circularly polarizing plate and a display device that includes the circularly polarizing plate. The circularly polarizing plate can be applied to a display device such as an organic light emitting display device to minimize blocking of light in the visible light region affecting image quality while blocking harmful ultraviolet rays appropriately and also has excellent durability.

16 Claims, 6 Drawing Sheets

(51) Int. Cl.
  *H01L 51/52* (2006.01)
  *C09K 19/24* (2006.01)
  *C09K 19/04* (2006.01)

(52) U.S. Cl.
  CPC ........ *G02B 5/3016* (2013.01); *H01L 51/5293* (2013.01); *C09K 2019/0448* (2013.01); *C09K 2323/03* (2020.08); *C09K 2323/031* (2020.08); *C09K 2323/035* (2020.08); *H01L 51/5281* (2013.01)

(58) Field of Classification Search
  CPC ............ C09K 19/3497; C09K 19/0448; C09K 19/24; C09K 2323/03; C09K 2323/031; C09K 2323/035
  USPC ........ 428/1.1, 1.3, 1.31, 1.33, 500; 349/117, 349/96; 359/485.03
  See application file for complete search history.

(56) References Cited

U.S. PATENT DOCUMENTS

| | | | |
|---|---|---|---|
| 8,287,756 | B2 | 10/2012 | Verrall et al. |
| 8,368,849 | B2 | 2/2013 | Chang et al. |
| 9,690,020 | B2 | 6/2017 | Youn et al. |
| 9,891,360 | B2 | 2/2018 | Chang et al. |
| 10,132,974 | B2 | 11/2018 | Furuki et al. |
| 10,539,714 | B2 | 1/2020 | Ishii et al. |
| 10,690,824 | B2 | 6/2020 | Ozawa et al. |
| 10,746,912 | B2 | 8/2020 | Choi et al. |
| 2010/0137578 | A1 | 6/2010 | Kataoka et al. |
| 2011/0299000 | A1* | 12/2011 | Woodgate ............ G02B 5/0278 349/15 |
| 2015/0092264 | A1 | 4/2015 | Youn et al. |
| 2016/0154157 | A1 | 6/2016 | Cho et al. |
| 2017/0022418 | A1 | 1/2017 | Kasai et al. |
| 2017/0047555 | A1* | 2/2017 | Ishiguro ............... H01L 51/5293 |
| 2017/0145312 | A1 | 5/2017 | Hida et al. |
| 2018/0002460 | A1 | 1/2018 | Endo et al. |
| 2018/0037817 | A1 | 2/2018 | Kuwana et al. |
| 2018/0327669 | A1* | 11/2018 | Hatsusaka ............. C09K 19/02 |
| 2019/0276744 | A1 | 9/2019 | Hida et al. |
| 2020/0024520 | A1 | 1/2020 | Nakajima et al. |

FOREIGN PATENT DOCUMENTS

| | | | |
|---|---|---|---|
| CN | 101652685 | | 2/2010 |
| EP | 1685441 | A1 | 8/2006 |
| JP | H08-321381 | | 12/1996 |
| JP | 2004-233988 | | 8/2004 |
| JP | 2009-122662 | | 6/2009 |
| JP | 2013083956 | | 5/2013 |
| JP | 2013097873 | | 5/2013 |
| JP | 2013-152390 | | 8/2013 |
| JP | 2014-026288 | | 2/2014 |
| JP | 2015-146002 | | 8/2015 |
| JP | 2015-536483 | | 12/2015 |
| JP | 2017-101235 | | 6/2017 |
| JP | 2017-120430 | | 7/2017 |
| KR | 10-1017887 | | 3/2011 |
| KR | 10-2015-0037421 | | 4/2015 |
| KR | 10-2015-0095980 | | 8/2015 |
| KR | 10-20160117469 | | 10/2016 |
| KR | 10-2017-0012102 | | 2/2017 |
| KR | 10-1742845 | | 6/2017 |
| KR | 10-20170061078 | | 6/2017 |
| WO | 2016-052360 | | 4/2016 |
| WO | 2016-114253 | | 7/2016 |
| WO | 2016-114254 | | 7/2016 |
| WO | 2016-114255 | | 7/2016 |
| WO | 2016-132606 | | 8/2016 |
| WO | 2016-140499 | | 9/2016 |
| WO | WO-2017038265 | A1 * | 3/2017 ......... C09K 19/3833 |
| WO | 2018-173778 | | 9/2018 |

* cited by examiner

[Figure 1]
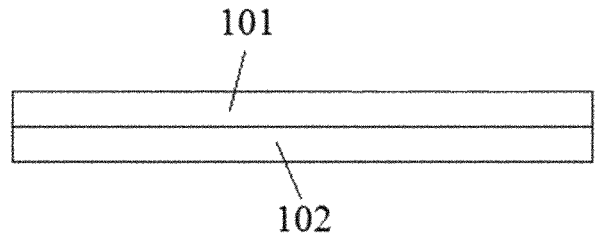
[Figure 2]
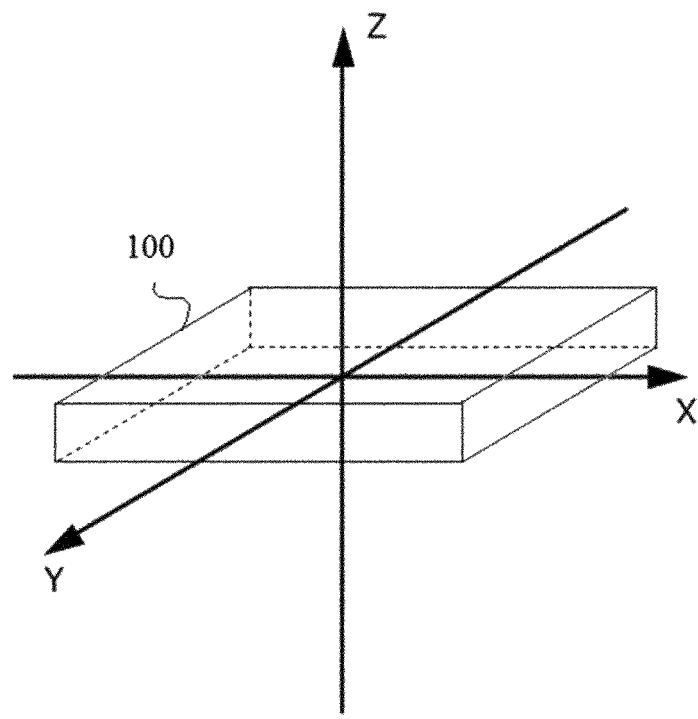
[Figure 3]
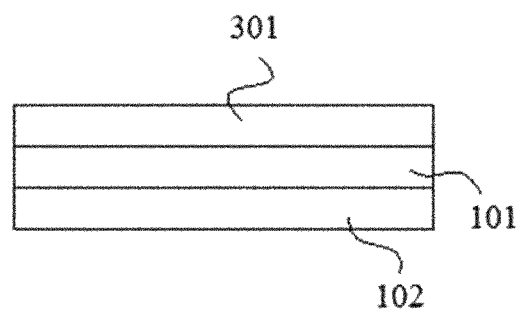

[Figure 4]
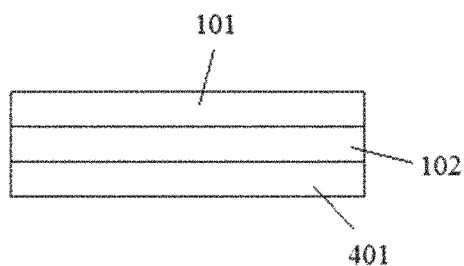
[Figure 5]
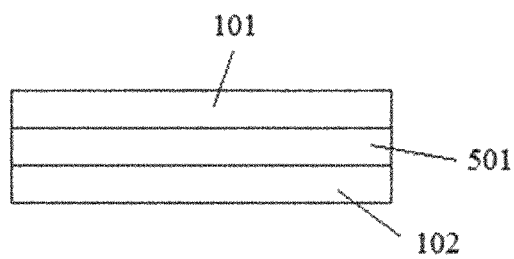
[Figure 6]
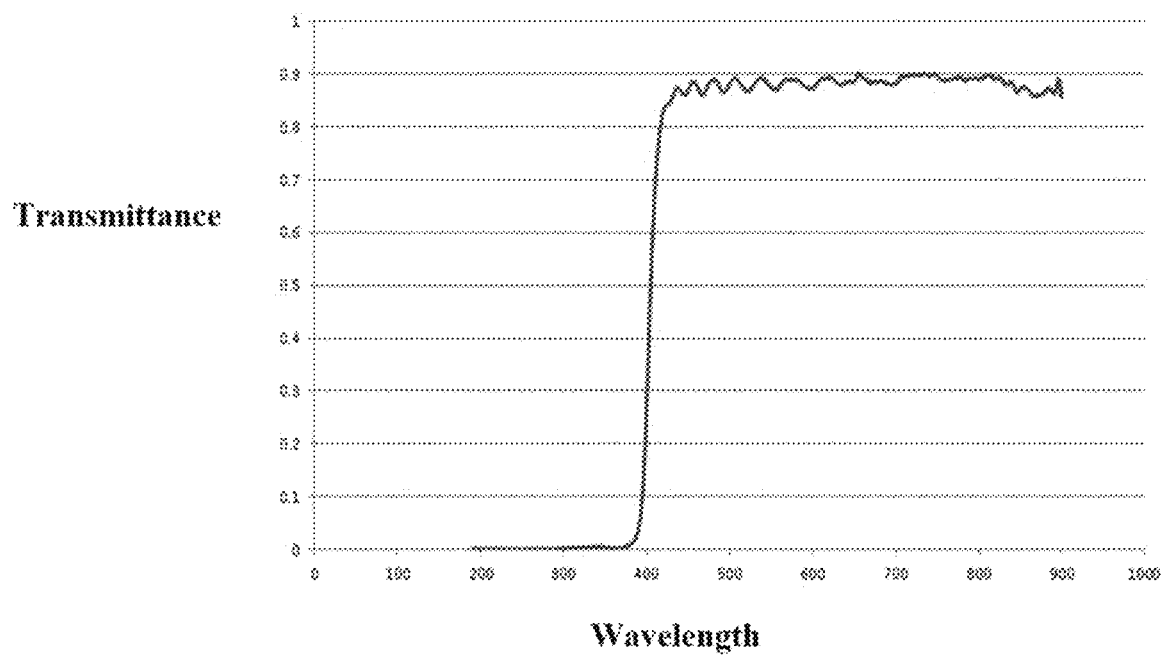

[Figure 7]
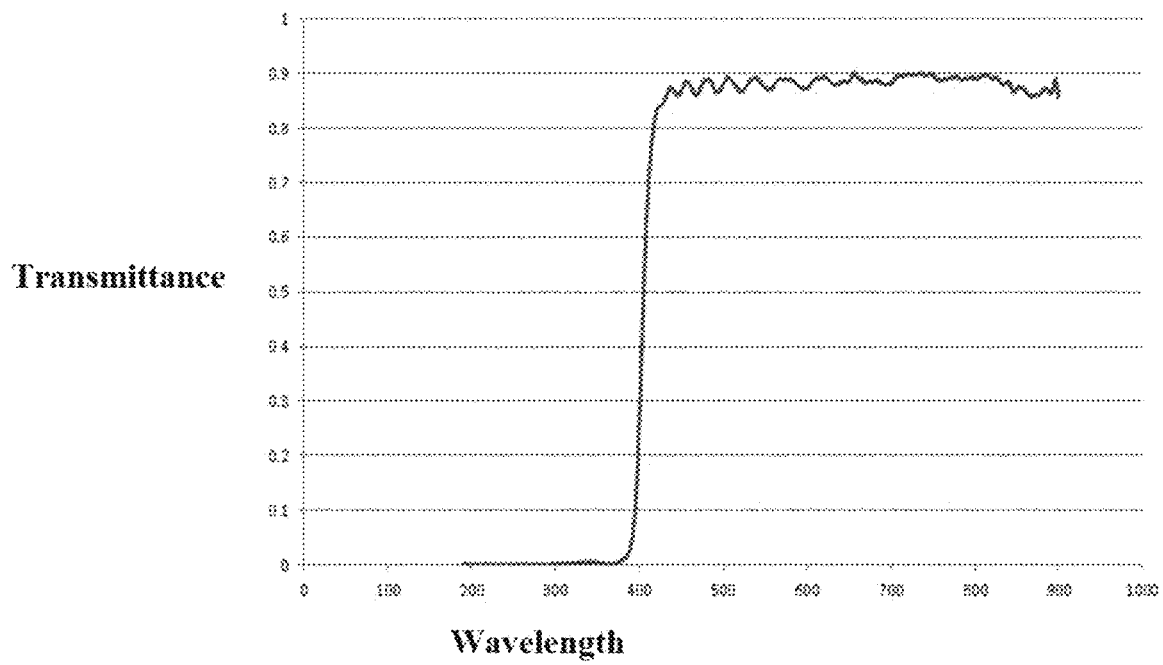
[Figure 8]
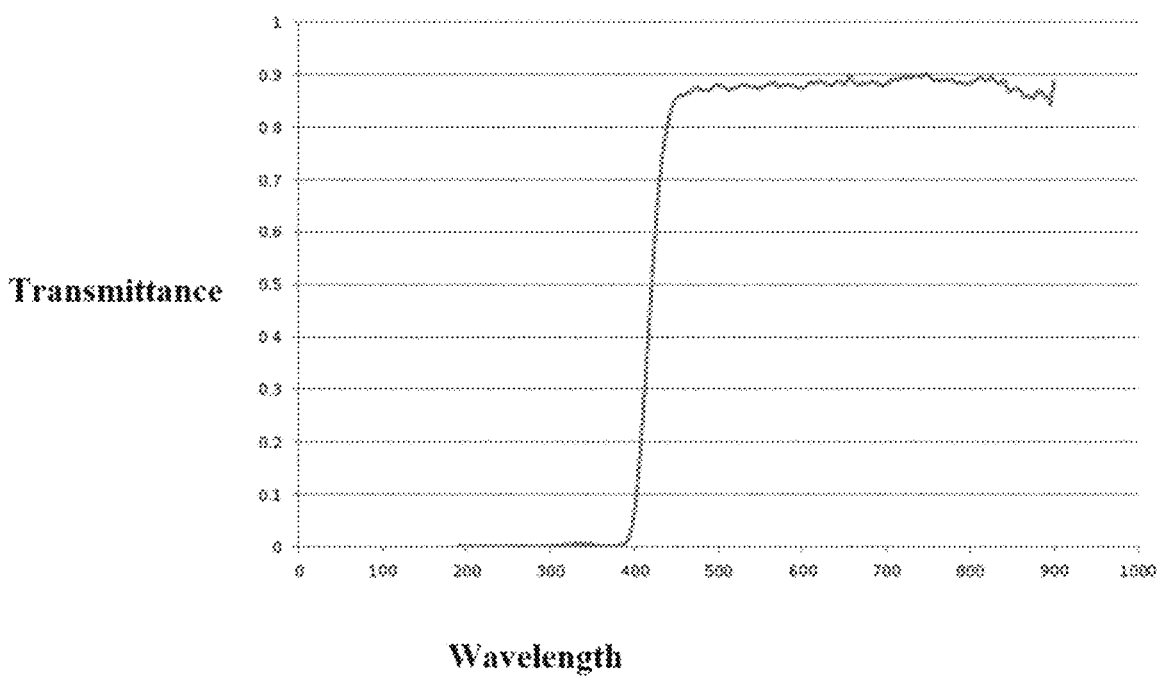

[Figure 9]
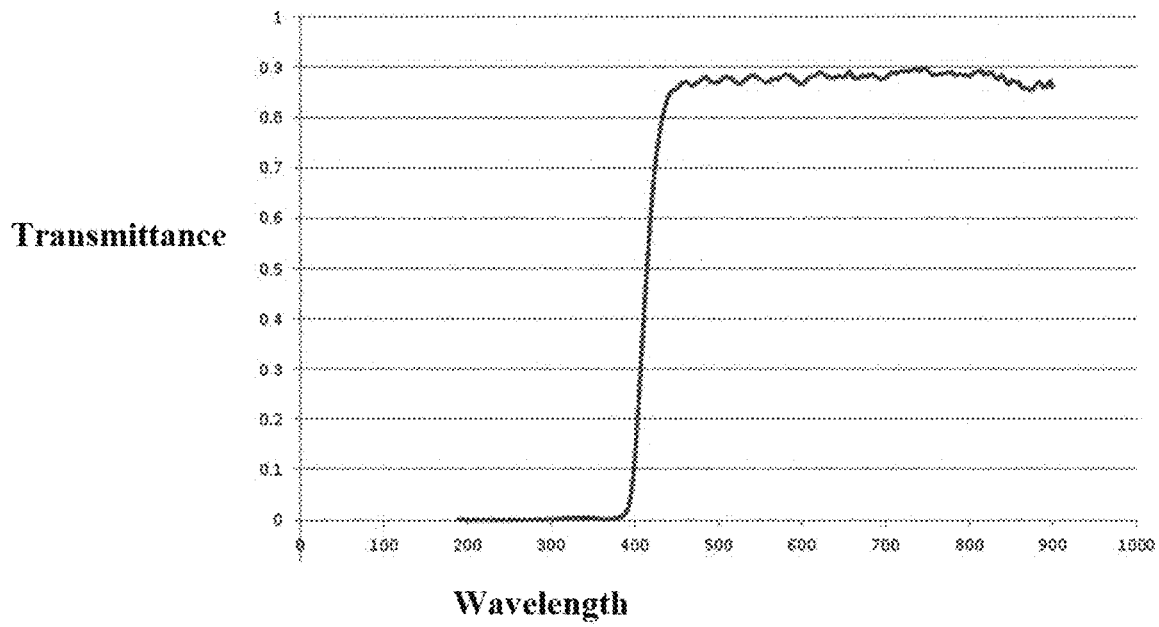
[Figure 10]
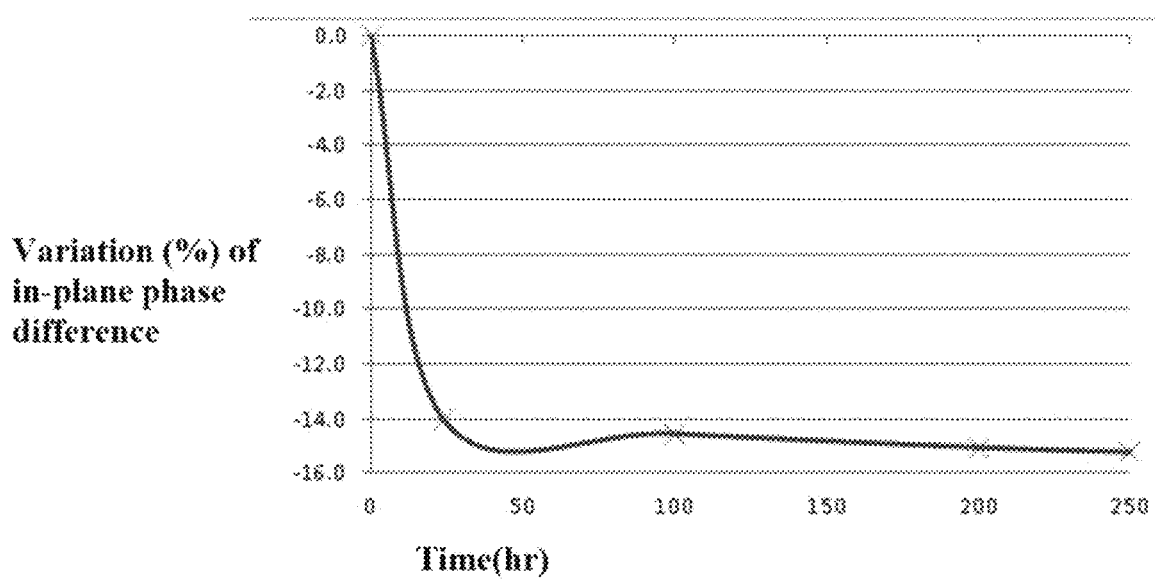

[Figure 11]
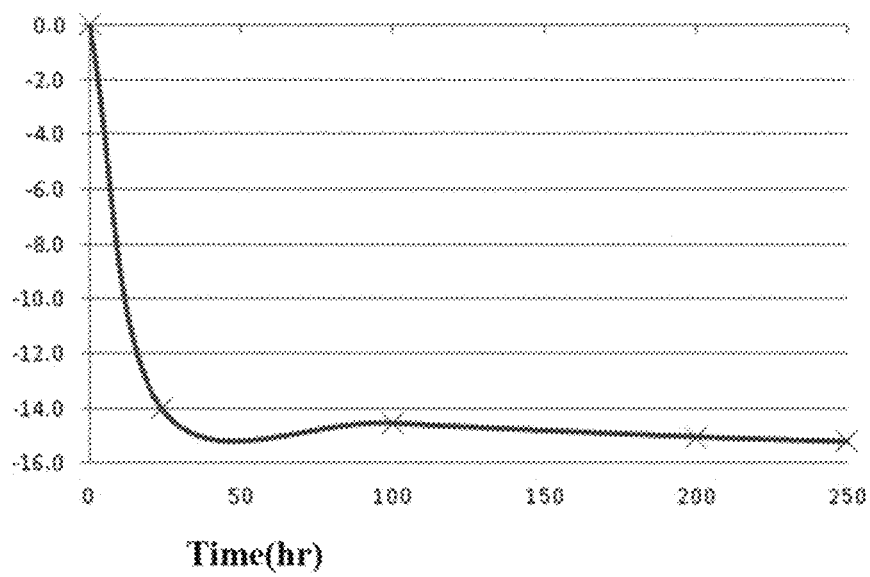
[Figure 12]
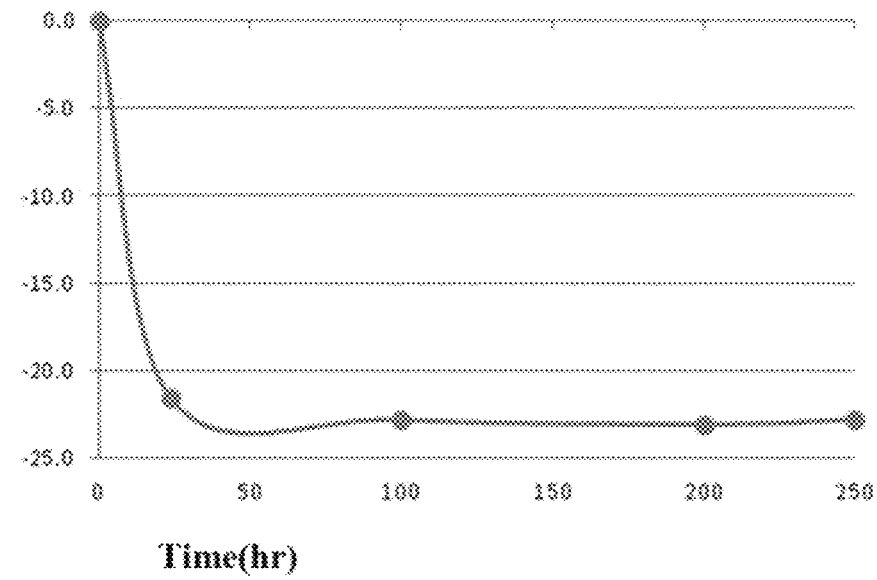

[Figure 13]
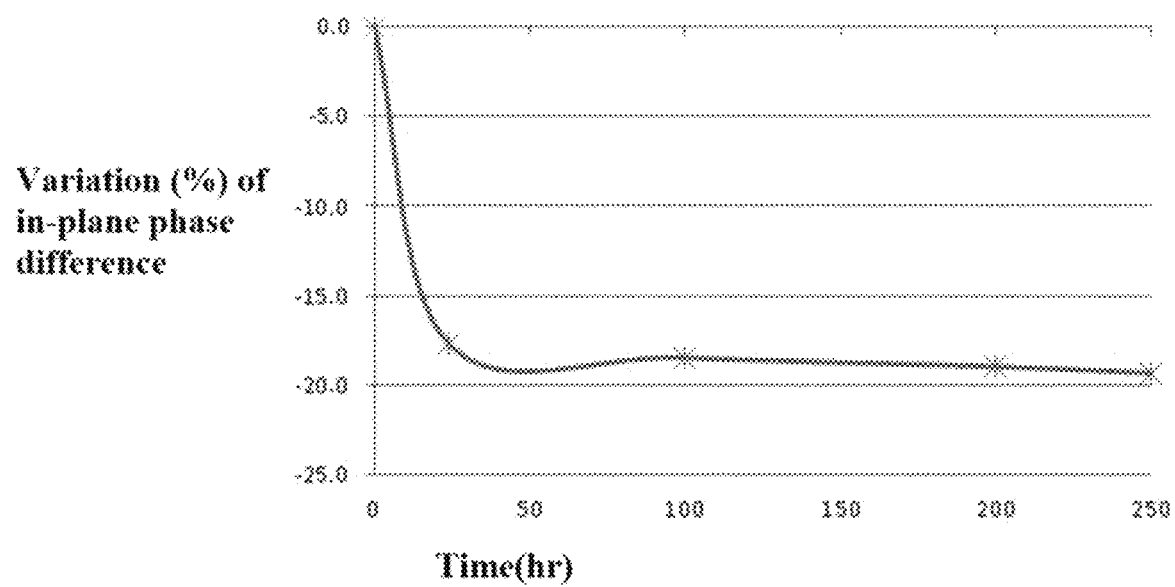

CIRCULARLY POLARIZING PLATE

CROSS-REFERENCE TO RELATED APPLICATIONS

This application is a National Stage Application of International Application No. PCT/KR2018/007785 filed on Jul. 10, 2018, which claims the benefit of Korean Patent Application No. 10-2017-0087122 filed on Jul. 10, 2017, the disclosure of which is incorporated herein by reference in its entirety.

TECHNICAL FIELD

The present application relates to a circularly polarizing plate.

BACKGROUND

A so-called circularly polarizing plate basically comprising a polarizer and a phase difference layer can be used for preventing external light reflection by a reflective electrode in an organic light emitting device. For example, Patent Document 1 discloses a method of arranging a circularly polarizing plate toward a transparent electrode in an organic light emitting device.

Techniques for imparting an ultraviolet block function to an optical film such as a circularly polarizing plate have been known, where their representative method is a method of adding an ultraviolet absorber or a light stabilizer to a protective film laminated to protect a polarizer as shown in Patent Document 2.

However, the conventional method of adding an ultraviolet absorber or a light stabilizer to a protective film blocks ultraviolet rays having a wavelength in the range of less than about 380 nm, but does not efficiently block ultraviolet rays in the range of 380 nm to 400 nm, and there is no technique that recognizes the necessity to block ultraviolet rays in the above range.

However, when the circularly polarizing plate is applied to an organic light emitting device in particular, the light having a wavelength in the range of 380 to 400 nm, which is not blocked by the conventional technique, adversely affects durability of the organic light emitting device. In addition, the light having a wavelength in the above range which is not blocked by the circularly polarizing plate to be reflected by the reflective electrode may adversely affect the health of the observer.

In order to simply block the light having a wavelength in the range of 380 nm to 400 nm, a method of incorporating an ultraviolet absorber or light stabilizer having a maximum absorption wavelength in the relevant range into the constitution of the protective film or other circularly polarizing plates may be considered. However, if the wavelength range blocked by the ultraviolet absorber or the light stabilizer is not precisely adjusted, the light in a short wavelength visible light region may be blocked by the circularly polarizing plate, which may affect display quality, such as causing color sense change. Furthermore, when the ultraviolet absorber or the light stabilizer is contained in the layer formed by a liquid crystal compound, the relevant components may adversely affect the entire durability of the circularly polarizing plate.

PRIOR ART DOCUMENTS

Patent Documents (Patent Document 1) Japanese Laid-Open Patent Publication No. H8-321381
(Patent Document 2) Korean Patent No. 1742845

Technical Problem

The present application relates to a circularly polarizing plate. It is one object of the present application to provide a circularly polarizing plate having excellent durability in itself, while selectively and effectively blocking light in an ultraviolet region that may affect the durability of a display device and the like, without affecting display performance of the display device such as color senses or image quality.

Technical Solution

An exemplary circularly polarizing plate comprises a polarizer and a phase difference layer. The phase difference layer can be laminated on one side of the polarizer. FIG. 1 shows an exemplary circularly polarizing plate comprising a polarizer (101) and a phase difference layer (102) which are sequentially laminated.

In the circularly polarizing plate of the present application, the polarizer and/or phase difference layer are designed to have optical characteristics controlled for light in the ultraviolet region, particularly at any one wavelength in a range of 380 nm to 400 nm or wavelengths in a certain range. In particular, the present application can provide a circularly polarizing plate matching the object of the present application by designing the phase difference layer so as to be capable of selectively blocking the ultraviolet region of a specific wavelength without applying an additive such as an ultraviolet absorber or a light stabilizer.

The circularly polarizing plate of the present application is capable of securing stable durability in itself while effectively blocking ultraviolet rays affecting the durability of the device by such a design, and can also be applied to a display device to maintain its display quality excellently.

In this specification, the term polarizer means a film, sheet or element having a polarization function. The polarizer is a functional element capable of extracting light that vibrates in one direction from incident light that vibrates in various directions.

In the present application, as the polarizer, an absorptive linear polarizer can be used. As such a polarizer, a PVA (poly(vinyl alcohol)) polarizer is known. Basically, in the present application, a known polarizer can be used as the polarizer. In one example, as the known PVA (poly(vinyl alcohol)) polarizer, a polarizer having the following characteristics can be applied.

As the polarizer applied in the present application, a polarizer having single transmittance (Ts) for light having a wavelength of 390 nm of 20% or more, or 60% or less, can be used. In another example, the single transmittance of the polarizer for light having a wavelength of 390 nm can be 59% or less, 58% or less, 57% or less, 56% or less, 55% or less, 54% or less, 53% or less, 52% or less, 51% or less, 50% or less, 49% or less, 48% or less, 47% or less, 46% or less, 45% or less, 44% or less, 43% or less, 42% or less, 41% or less, or 40% or less, or can be 21% or more, 22% or more, 23% or more, 24% or more, or 25% or more.

The single transmittance of the polarizer can be measured using, for example, a spectrometer (V7100, manufactured by Jasco). For example, after the air is set to the base line in a state where the polarizer sample (not including the upper and lower protective films) is placed on the apparatus and each transmittance is measured in a state in which the axis of the polarizer sample is vertically and horizontally aligned with the axis of the reference polarizer, the single transmittance can be calculated.

The circularly polarizing plate can be imparted with an appropriate ultraviolet blocking property and maintain durability stably by combining the polarizer whose single transmittance for light having a wavelength of 390 nm is controlled in the above range with a phase difference layer to be described below.

In general, the PVA (poly(vinyl alcohol))-based linear absorptive polarizer exhibits the above single transmittance, and in the present application, such a PVA-based linear absorptive polarizer can be applied, but the kind of the polarizer that can be applied is not limited to the above, as long as it exhibits the above single transmittance.

The PVA polarizer generally comprises a PVA film or sheet and an anisotropic absorbent material, such as a dichroic dye or iodine, adsorbed and oriented on the PVA film or sheet.

The PVA film or sheet can be obtained, for example, by gelling polyvinyl acetate. The polyvinyl acetate can be exemplified by a homopolymer of vinyl acetate; and a copolymer of vinyl acetate and other monomers, and the like. Here, the other monomers copolymerized with vinyl acetate can be exemplified by one or two or more of an unsaturated carboxylic acid compound, an olefinic compound, a vinyl ether compound, an unsaturated sulfonic acid compound and an acrylamide compound having an ammonium group, and the like.

The polyvinyl acetate has generally a gelation degree of about 85 mol % to about 100 mol % or 98 mol % to 100 mol % or so. The polyvinyl alcohol in the linear polarizer can have generally a polymerization degree of about 1,000 to about 10,000 or about 1,500 to about 5,000.

The PVA polarizer is produced via a dyeing process and a stretching process on the PVA film or sheet. If necessary, the production process of the polarizer can further comprise a swelling, crosslinking, cleaning and/or drying process.

Here, for example, the dyeing process is a process for adsorbing iodine, which is an anisotropic absorbent material, on a PVA film or sheet, and can be performed by immersing the PVA film or sheet in a treatment tank containing iodine and potassium iodide, where in this procedure, the single transmittance can be controlled by a method of controlling the concentration of iodine and potassium iodide in the treatment tank.

In the dyeing process, the PVA film or sheet is immersed in a dyeing solution or a crosslinking solution containing an iodide such as iodine ($I_2$) or KI and/or a boric acid compound (boric acid or a borate) or the like, where in this procedure, the anisotropic absorbent material such as iodine is adsorbed on the PVA film or sheet. Accordingly, in the procedure, the kind or amount of the anisotropic absorbent material adsorbed on the polarizer is determined depending on the concentration of the compound in the dyeing solution, whereby the absorption rate and transmittance of the polarizer for light having a specific wavelength can be determined.

For example, a species of the iodine compound that can be present in the dyeing solution can be $I^-$, $I_2$, $I_3^-$ or $I_5^-$, and the like derived from an iodide ($M+I^-$) and iodine ($I_2$). Among these compounds, $I^-$ has an absorption wavelength range of about 190 nm to 260 nm and its effect on the color sense is not significant, $I_2$ has an absorption wavelength range of about 400 nm to 500 nm and its color sense is mainly red, $I_3^-$ has an absorption wavelength range of about 250 nm to 400 nm and its color sense is mainly yellow, $I_5^-$ of the linear structure has no observed absorption wavelength range and its effect on the color sense is not significant, and $I_5^-$ of the curved structure has an absorption wavelength range of about 500 nm to 900 nm and its color sense is mainly blue.

Therefore, by controlling the species ratio of the iodine compound formed in the dyeing solution, it is possible to control the single transmittance for light having a wavelength of 390 nm.

The dyeing solution is generally an iodine solution which is an aqueous solution in which iodine ions are formed through iodine, and an iodide as a solubilizing aid, and a boric acid compound is also added to the aqueous solution for the crosslinking process, where the species and ratio of the iodine compound formed in the relevant dyeing solution can be determined depending on the concentration of the iodine and iodide added to the aqueous solution. As the iodinated compound, for example, potassium iodide, lithium iodide, sodium iodide, zinc iodide, aluminum iodide, lead iodide, copper iodide, barium iodide, calcium iodide, tin iodide or titanium iodide, and the like can be used.

In order to produce a polarizer that satisfies the transmittance for light having a wavelength of 390 nm, which is a condition of the present application, it can be controlled so that the concentration of the iodide in the dyeing solution used in the dyeing process is about 1.5 wt % or more and the concentration of the iodine ($I_2$) is 0.05 to 20 wt % or so. In another example, the concentration of the iodide can be about 20 wt % or less, 18 wt % or less, 16 wt % or less, 14 wt % or less, 12 wt % or less, 10 wt % or less, 8 wt % or less, or about 7 wt % or less. Also, in another example, the concentration of the iodine can be 19 wt % or less, 18 wt % or less, 17 wt % or less, 16 wt % or less, 15 wt % or less, 14 wt % or less, 13 wt % or less, 12 wt % or less, 11 wt % or less, 10 wt % or less, 9 wt % or less, 8 wt % or less, 7 wt % or less, 6 wt % or less, 5 wt % or less, 4 wt % or less, 3 wt % or less, 2 wt % or less, or 1 wt % or less or so.

If the concentration of the iodide and/or iodine in the dyeing solution is adjusted to the above range, the species and concentration of the iodine compound in the dyeing solution can be formed so that the single transmittance for light having a wavelength of 390 nm can fall within the above-mentioned range.

For the production of the polarizer applied in the present application, the concentration of the dyeing liquid applied in the dyeing process can be adjusted as described above, and other processes can be performed according to generally known methods. In addition, the dyeing process can also be performed according to a known method, except that the concentration of the dyeing solution is controlled as described above.

For example, in the dyeing process, a PVA film or sheet can be immersed into the dyeing solution controlled as above. In the dyeing process, the temperature of the dyeing solution is usually about 20° C. to 50° C. or 25° C. to 40° C. or so, and the immersing time is usually 10 seconds to 300 seconds or 20 seconds to 240 seconds or so, but is not limited thereto.

In the production procedure of the polarizer, a crosslinking process can also be performed. The crosslinking process can be performed using, for example, a crosslinking agent such as a boron compound. The order of such a crosslinking process is not particularly limited, and it can be performed, for example, together with a dyeing and/or stretching process, or proceed separately. For example, when a crosslinking agent is additionally combined in the above-mentioned dyeing solution, the crosslinking process can proceed simultaneously with dyeing. Such a crosslinking process can also be performed plural times. As the boron compound, boric acid or borax, and the like can be used. The boron compound can be generally used in the form of an aqueous solution or a mixed solution of water and an organic solvent, and usually an aqueous solution of boric acid is used. The boric acid concentration in the boric acid aqueous solution can be selected in an appropriate range in consideration of the degree of crosslinking and the heat resistance thereof, and the like. An iodinated compound such as potassium iodide can also be contained in a boric acid aqueous solution or the like.

The crosslinking process can be performed by immersing the PVA film or sheet in a boric acid aqueous solution or the like, where in this procedure, the treatment temperature is usually in a range of 25° C. or higher, 30° C. to 85° C. or 30° C. to 60° C. or so, and the treatment time is usually 5 seconds to 800 seconds or 8 seconds to 500 seconds or so, but is not limited thereto.

The stretching process is generally performed by uniaxial stretching. Such stretching can be performed together with the dyeing and/or crosslinking process. The stretching method is not particularly limited, and for example, a wet stretching method can be applied. In such a wet stretching method, for example, it is common to perform stretching after dyeing, but stretching can be performed together with crosslinking, which can also be performed plural times or in multiple stages.

An iodinated compound such as potassium iodide can be contained in the treatment liquid applied to the wet stretching method. In stretching, the treatment temperature is usually in a range of 25° C. or higher, 30° C. to 85° C. or 50° C. to 70° C., and the treatment time is usually 10 seconds to 800 seconds or 30 seconds to 500 seconds, but is not limited thereto.

The total draw ratio during the stretching procedure can be adjusted in consideration of orientation characteristics and the like, and the total draw ratio can be 3 to 10 times, 4 to 8 times, or 5 to 7 times, based on the original length of the PVA film or sheet, but is not limited thereto. Here, the total draw ratio can mean a cumulative draw ratio including the stretching in each process in the case of involving the stretching even in the swelling process or the like other than the stretching process. Such a total draw ratio can be adjusted in consideration of the orientation property, workability, or stretch cutting possibility, and the like.

In addition to the dyeing, crosslinking and stretching, the swelling process can also be performed before the processes are performed. It is possible to clean contamination or a blocking inhibitor of the PVA film or sheet surface by the swelling, whereby there is also an effect capable of reducing unevenness such as a dyeing deviation.

In the swelling process, water, distilled water or pure water, and the like can be usually used. The main component of the concerned treatment liquid is water, and if necessary, it can contain a small amount of an additive such as an iodinated compound such as potassium iodide or a surfactant, or an alcohol, and the like. In this procedure, it is also possible to adjust the above-described light blocking rate by controlling process variables.

The treatment temperature in the swelling process is usually about 20° C. to 45° C. or 20° C. to 40° C. or so, but is not limited thereto. Since the swelling deviations can cause the dyeing deviation, the process variables can be adjusted so that the occurrence of such swelling deviations is suppressed as much as possible.

Proper stretching can also be performed in the swelling process. The draw ratio can be 6.5 times or less, 1.2 to 6.5 times, 2 times to 4 times, or 2 times to 3 times or so, based on the original length of the PVA film. The stretching in the swelling procedure can control the stretching in the stretching process performed after the swelling process to be small and control it so that the stretching breakage of the film does not occur.

In the production procedure of the polarizer, metal ion treatment can be performed. This treatment is performed, for example, by immersing the PVA film in an aqueous solution containing a metal salt. This allows the metal ions to be contained in the polarizer, where in this procedure, the color tone of the PVA polarizer can also be controlled by adjusting the kind or ratio of metal ions. The applicable metal ions can be exemplified by metal ions of a transition metal such as cobalt, nickel, zinc, chromium, aluminum, copper, manganese or iron, and the adjustment of the color tone can also be possible by selecting an appropriate type of these.

After the dyeing, crosslinking and stretching, the cleaning process can proceed. Such a cleaning process can be performed by an iodine compound solution such as potassium iodide.

Such cleaning with water and cleaning with the iodine compound solution can be combined, where a solution in which a liquid alcohol such as methanol, ethanol, isopropyl alcohol, butanol or propanol is combined can also be used.

After passing through such a process, the polarizer can be produced by performing a drying process. In the drying process, for example, it can be performed at an appropriate temperature for an appropriate time in consideration of the required moisture content and the like, and such conditions are not particularly limited.

The polarizer produced in such a manner can comprise a PVA film or sheet and an anisotropic absorbent material which is adsorbed and oriented on the PVA film or sheet. Here, the anisotropic absorbent material can be iodine, and in the present application, such a polarizer can be referred to as an iodine PVA polarizer.

Although the above description has been made on the iodine PVA polarizer among the known polarizers with respect to the polarizers applicable to the present application, the kind of the polarizers applicable in the present application is not limited to the above, and as long as the single transmittance for light having a wavelength of 390 nm falls within the above-described range, any kind of polarizer, among the various known polarizers, can also be applied in the present application.

In the circularly polarizing plate, a phase difference layer is present on one side of the polarizer. In the present application, the phase difference layer has blocking ability or absorbing ability against ultraviolet rays in a predetermined wavelength range in itself. For example, the phase difference layer can have transmittance for light having wavelengths of 385 nm, 390 nm, 395 nm, and/or 400 nm in a predetermined range.

For example, the phase difference layer can have transmittance of 3% or less for light having a wavelength of 385 nm. In another example, the transmittance can be 2.9% or less, 2.8% or less, 2.7% or less, 2.6% or less, 2.5% or less, 2.4% or less, 2.3% or less, 2.2% or less, 2.1% or less, 2.0% or less, 1.9% or less, 1.8% or less, 1.7% or less, 1.6% or less, 1.5% or less, or 1.4% or less. In another example, the transmittance can be 0% or more, 0.1% or more, 0.2% or more, 0.3% or more, 0.4% or more, 0.5% or more, 0.6% or more, 0.7% or more, 0.8% or more, 0.9% or more, 1.0% or more, 1.1% or more, 1.2% or more, 1.3% or more, 1.4% or more, 1.5% or more, 1.6% or more, or 1.65% or more.

For example, the phase difference layer can have transmittance of 15% or less for light having a wavelength of 390 nm. In another example, the transmittance can be 14% or less, 13% or less, 12% or less, 11% or less, 10% or less, 9% or less, 8% or less, 7% or less, 6% or less, 5% or less, 4% or less, or 3.5% or less. In another example, the transmittance can be 0% or more, 0.1% or more, 0.2% or more, 0.3% or more, 0.4% or more, 0.5% or more, 0.6% or more, 0.7% or more, 0.8% or more, 0.9% or more, 1% or more, 1.5% or more, 2% or more, 2.5% or more, 2.6% or more, 2.7% or more, 2.8% or more, 2.9% or more, 3.1% or more, 3.2% or more, 3.3% or more, 3.4% or more, 3.5% or more, or 3.6% or more.

For example, the phase difference layer can have transmittance of 25% or less for light having a wavelength of 395 nm. In another example, the transmittance can be 24% or less, 23% or less, 22% or less, 21% or less, 20% or less, 19% or less, 18% or less, 17% or less, 16% or less, 15, 14% or less, 13% or less, 12% or less, 11% or less, 10% or less, 9% or less, 8% or less, 7% or less, 6% or less, 5% or less, 4% or less, or 3.5% or less. In another example, the transmittance can be 0% or more, 0.1% or more, 0.2% or more, 0.3% or more, 0.4% or more, 0.5% or more, 0.6% or more, 0.7% or more, 0.8% or more, 0.9% or more, 1% or more, 1.5% or more, 2% or more, 2.5% or more, 3% or more, 3.5% or more, 4% or more, 4.5% or more, 5% or more, 5.5% or more, 6% or more, 6.5% or more, 7% or more, 7.5% or more, 8% or more, 8.5% or more, 9% or more, or 9.5% or more.

For example, the phase difference layer can have transmittance of 40% or less for light having a wavelength of 400 nm. In another example, the transmittance can be 39.5% or less, 39% or less, 38.5% or less, 38% or less, 37.5% or less, 37% or less, 36.5% or less, 36% or less, 35.5% or less, 35% or less, 34.5% or less, 34% or less, 33.5% or less, 33% or less, 32.5% or less, 32% or less, 31.5% or less, 31% or less, 30% or less, 29.5% or less, 29% or less, 28.5% or less, 28% or less, 27.5% or less, or 27% or less or so. The transmittance can be 0% or more, 0.1% or more, 0.2% or more, 0.3% or more, 0.4% or more, 0.5% or more, 0.6% or more, 0.7% or more, 0.8% or more, 0.9% or more, 1% or more, 1.5% or more, 2% or more, 2.5% or more, 3% or more, 3.5% or more, 4% or more, 4.5% or more, 5% or more, 5.5% or more, 6% or more, 6.5% or more, 7% or more, 7.5% or more, 8% or more, 8.5% or more, 9% or more, 9.5% or more, 10% or more, 10.5% or more, 11% or more, 11.5% or more, 12% or more, 12.5% or more, 13% or more, 13.5% or more, 14% or more, 14.5% or more, 15% or more, 15.5% or more, 16% or more, 16.5% or more, 17% or more, 17.5% or more, 18% or more, 18.5% or more, 19% or more, 19.5% or more, 20% or more, 20.5% or more, 21% or more, 21.5% or more, 22% or more, 22.5% or more, 23% or more, 23.5% or more, 24% or more, 24.5% or more, or 25% or more or so.

The transmittance of the phase difference layer can be measured using, for example, a spectrometer (N&K analyzer, N&K Technologies, INC). For example, the transmittance of the phase difference layer can be measured after the relevant phase difference layer sample is positioned on a base material which preferably exhibits no absorption peak at a wavelength of 380 nm or more, where a liquid crystal alignment film or the like can also be present between the base material and the phase difference layer. Here, the type of the base material which exhibits no absorption peak at a wavelength of 380 nm or more is not particularly limited, and for example, is an NRT base film or a TAC (triacetyl cellulose) base film (transmittance for 385 nm: 90.8%, transmittance for 390 nm: 91.1%, transmittance for 395 nm: 91.2%, or transmittance for 400 nm: 91.4%), and the like. For example, after the phase difference layer is positioned on the base material and the air is set to baseline, each transmittance is measured in a state of being vertically and horizontally aligned with the reference axis (slow axis) of the phase difference layer sample, and then the transmittance is calculated.

The phase difference layer having the transmittance characteristics designed as above can ensure that the circularly polarizing plate has stable durability while exhibiting a blocking property for light having a wavelength in the range of 380 to 400 nm.

In particular, this effect can be further improved in combination with the above-mentioned polarizer. That is, when the single transmittance of the polarizer and/or the transmittance of the phase difference do not satisfy the above-mentioned range, the ultraviolet blocking ability of the circularly polarizing plate, particularly the blocking ratio to light in the range of 380 to 400 nm is lowered or the ultraviolet blocking ability is excessively given to any one of the polarizer and the phase difference layer, so that the durability of the circularly polarizing plate can be deteriorated.

In the present application, the ultraviolet blocking ability of the phase difference layer as above can also be realized without introducing an ultraviolet absorber or a light stabilizer, and the like into the phase difference layer separately. Therefore, in one example, the phase difference layer may not include an ultraviolet absorber or a light stabilizer, for example, an ultraviolet absorber or a light stabilizer, having a maximum absorption wavelength in the range of 385 nm to 400 nm. That is, when the phase difference layer is constituted by suitably combining a normal dispersion polymerizable liquid crystal compound and a reverse dispersion polymerizable liquid crystal compound as described below, the structural characteristics of the individual polymerizable liquid crystal compounds are complementary to each other, whereby the desired ultraviolet absorptivity can be ensured without applying an ultraviolet absorber or a light stabilizer and the like. By applying no ultraviolet absorber and light stabilizer in this way, it is possible to form a phase difference layer having excellent durability that does not cause poor orientation of liquid crystals by the additives or a bleeding-out phenomenon after formation of the phase difference layer, and the like.

In one example, the phase difference layer having the ultraviolet blocking ability can be realized by designing a reverse wavelength characteristic in the same manner as described below.

The phase difference layer can be a layer having a refractive index relationship according to any one of the following equations 1 to 3.

$$nx > ny = nz \qquad \text{[Equation 1]}$$

$$nx > ny > nz \qquad \text{[Equation 2]}$$

$$nx > ny \text{ and } nz > ny \qquad \text{[Equation 3]}$$

In Equations 1 to 3, $nx$, $ny$ and $nz$ are the refractive index in the x-axis direction (slow axis direction), the refractive index in the y-axis direction (fast axis direction) and the refractive index in the z-axis direction, respectively, and this definition can be applied equally herein, unless otherwise specified. Here, for example, as shown in FIG. 2, the x-axis direction can mean the slow axis direction on the surface of the phase difference layer (100) in the form of a film or a sheet, the y-axis direction can mean a planar direction (fast axis direction) perpendicular to the x-axis, and the z-axis direction can mean the direction of the normal of the plane formed by the x-axis and the y-axis, for example, the thickness direction.

Unless otherwise specified, the term refractive index herein is the refractive index for light of a wavelength of about 550 nm.

The phase difference layer included in the circularly polarizing plate can have, for example, planar phase difference within a range capable of having a quarter-wave phase delay characteristic. In this specification, the term n-wave phase delay characteristic means a characteristic that the incident light can be phase-delayed by n times the wavelength of the incident light within at least a part of the wavelength range. The quarter-wave phase delay characteristic can be a characteristic that the incident linearly polarized light is converted into elliptically polarized light or circularly polarized light and conversely, the incident linearly polarized light or circularly polarized light is converted into linearly polarized light. In one example, the phase difference layer can have a planar phase difference for light having a wavelength of 550 nm in a range of 90 nm to 300 nm. In another example, the planar phase difference can be 100 nm or more, 105 nm or more, 110 nm or more, 115 nm or more, 120 nm or more, 125 nm or more, or 130 nm or more. In addition, the planar phase difference can be 290 nm or less, 280 nm or less, 270 nm or less, 260 nm or less, 250 nm or less, 240 nm or less, 230 nm or less, 220 nm or less, 210 nm or less, 200 nm or less, 190 nm or less, 180 nm or less, 170 nm or less, 160 nm or less, 150 nm or less, or 145 nm or less.

In this specification, the term planar phase difference is a value determined according to Equation 4 below, and the thickness direction phase difference is a value determined according to Equation 5 below.

$$Rin = d \times (nx - ny) \quad \text{[Equation 4]}$$

$$Rth = d \times (nz - ny) \quad \text{[Equation 5]}$$

In Equations 4 and 5, Rin is the planar phase difference, Rth is the thickness direction phase difference, nx, ny and nz are as defined in Equations 1 to 3 above, and d is the thickness of the phase difference layer.

For the phase difference layer, the range of the thickness direction phase difference obtained according to Equation 5 above is not particularly limited, which can be, for example, in a range of about −200 nm to 200 nm. In another example, the thickness direction phase difference can be −190 nm or more, −180 nm or more, −170 nm or more, −160 nm or more, −150 nm or more, −140 nm or more, −130 nm or more, −120 nm or more, −110 nm or more, −100 nm or more, −90 nm or more, −80 nm or more, −70 nm or more, −60 nm or more, −50 nm or more, −40 nm or more, −30 nm or more, −20 nm or more, or −10 nm or more. Also, in another example, the thickness direction phase difference can be 190 nm or less, 180 nm or less, 170 nm or less, 160 nm or less, 150 nm or less, 140 nm or less, 130 nm or less, 120 nm or less, 110 nm or less, 100 nm or less, 90 nm or less, 80 nm or less, 70 nm or less, 60 nm or less, 50 nm or less, 40 nm or less, 30 nm or less, 20 nm or less, or 10 nm or less.

In one example, the phase difference layer can be a layer satisfying the following equation 6.

$$R(450)/R(550) < R(650)/R(550) \quad \text{[Equation 6]}$$

In Equation 6, R (450) is the planar phase difference of the phase difference layer for light having a wavelength of 450 nm, R (550) is the planar phase difference of the phase difference layer for light having a wavelength of 550 nm, and R (650) is the planar phase difference of the phase difference layer for light having a wavelength of 650 nm.

Each of the planar phase differences complies with Equation 4 above, provided that in the planar phase difference for light having a wavelength of 450 nm, the refractive indexes for light having a wavelength of 450 nm are applied as nx and ny in Equation 4; in the planar phase difference for light having a wavelength of 550 nm, the refractive indexes for light having a wavelength of 550 nm are applied as nx and ny in Equation 4; and in the planar phase difference for light having a wavelength of 650 nm, the refractive indexes for light having a wavelength of 650 nm are applied as nx and ny in Equation 4.

The phase difference layer satisfying Equation 6 is a phase difference layer having a so-called reverse wavelength dispersion characteristic. Such a phase difference layer can exhibit the phase delay characteristic designed in a wide wavelength range.

It is possible to provide a circularly polarizing plate with better effects by controlling R (450)/R (550) and/or R (650)/R (550) in the phase difference layer satisfying Equation 6. In one example, R (450)/R (550) in Equation 6 above can be in a range of 0.6 to 0.99. In another example, R (450)/R (550) can be 0.61 or more, 0.62 or more, 0.63 or more, 0.64 or more, 0.65 or more, 0.66 or more, 0.67 or more, 0.69 or more, 0.70 or more, 0.71 or more, 0.72 or more, 0.73 or more, 0.74 or more, 0.75 or more, 0.76 or more, 0.77 or more, 0.78 or more, 0.79 or more, 0.80 or more, 0.81 or more, 0.82 or more, 0.83 or more, 0.84 or more, 0.85 or more, 0.86 or more, 0.87 or more, 0.88 or more, 0.89 or more, or 0.90 or more. In another example, the R (450)/R (550) can be 0.98 or less, 0.97 or less, 0.96 or less, 0.95 or less, 0.94 or less, 0.93 or less, 0.92 or less, 0.91 or less, 0.90 or less, 0.89 or less, 0.88 or more, 0.87 or more, 0.86 or less, or 0.85 or less. R (650)/R (550) in Equation 6 can be in a range of 1.00 to 1.19. The R (650)/R (550) can be 1.18 or less, 1.17 or less, 1.16 or less, 1.15 or less, 1.14 or less, 1.13 or less, 1.12 or less, 1.11 or less, 1.1 or less, or 1.08 or less or so. In another example, R (650)/R (550) in Equation 6 can be 1.01 or more, 1.02 or more, 1.03 or more, 1.04 or more, 1.05 or more, 1.06 or more, 1.07 or more, 1.08 or more, or 1.09 or more.

The method of adjusting R (450)/R (550) and/or R (650)/R (550) of the phase difference layer to the above range is not particularly limited, but in the present application, in order to secure the desired ultraviolet blocking ability even if the ultraviolet absorber or light stabilizer is not included, it can be realized by using two polymerizable liquid crystal compounds having different reverse wavelength characteristics as above, as described below.

The phase difference layer can be laminated on one side of the polarizer so that its slow axis and the absorption axis of the polarizer can form an angle within a range of about 30 degrees to 60 degrees. In another example, the angle can be 35 degrees or more, or 40 degrees or more, and can also be 55 degrees or less, or 50 degrees or less.

As the phase difference layer, a known material can be used without particular limitation, as long as it has the transmittance characteristic and the planar phase difference.

For example, a stretched polymer layer or liquid crystal layer obtained by stretching a polymer film capable of imparting optical anisotropy by stretching in a suitable manner can be used. As the liquid crystal layer, a liquid crystal polymer layer or a cured layer of a polymerizable liquid crystal compound can be used.

Here, as the stretched polymer layer, for example, a polymer layer can be used, which comprises polyolefin such as polyethylene or polypropylene, a cyclic olefin polymer (COP) such as polynorbornene, polyvinyl chloride, polyacrylonitrile, polysulfone, an acrylic resin, polycarbonate, polyester such as polyethylene terephthalate, polyacrylate, polyvinyl alcohol, a cellulose ester-based polymer such as TAC (triacetyl cellulose), or a copolymer of two or more monomers among the monomers forming the polymer, and the like.

As the phase difference layer, various known materials as above can be used, but generally known phase difference layers often do not satisfy the above-mentioned characteristics, in particular, the transmittance characteristics for light having a wavelength of 385 nm, 390 nm, 395 nm, or 400 nm.

Therefore, for example, when the stretched polymer layer is intended to be applied as a phase difference layer, a process of adding an additive having an appropriate absorption property for the above-mentioned wavelength upon producing the polymer layer can be required.

It is advantageous to apply a liquid crystal polymer layer or a cured layer of a polymerizable liquid crystal composition as a phase difference layer in order to secure the desired transmittance characteristic in the above-mentioned wavelength range, and particularly, it is advantageous to apply a cured layer of a polymerizable liquid crystal composition comprising a polymerizable liquid crystal compound having a specific reverse wavelength characteristic to be described below.

Accordingly, the phase difference layer can comprise at least a polymerized unit of a normal dispersion polymerizable liquid crystal compound to be described below and a polymerization unit of a reverse dispersion polymerizable liquid crystal compound to be also described below. Here, the polymerized unit means a unit formed by polymerizing or curing the respective polymerizable liquid crystal compounds, as described below.

For example, in the present application, a phase difference layer can be manufactured by mixing two or more polymerizable liquid crystal compounds so as to satisfy the properties of Equation 6 above, and for example, a polymerizable liquid crystal compound having a low value of R (450)/R (550) (for example, a reverse dispersion polymerizable liquid crystal compound as described below) and a polymerizable liquid crystal compound having a high value of R (450)/R (550) (for example, a normal dispersion polymerizable liquid crystal compound as described below) can be combined to satisfy the properties of Equation 6 above.

In this specification, the term "polymerizable liquid crystal compound" can mean a compound containing a moiety capable of exhibiting liquid crystallinity, such as a mesogen skeleton, and also containing one or more polymerizable functional groups. Such polymerizable liquid crystal compounds are variously known under the so-called RM (reactive mesogen). The polymerizable liquid crystal compound can be contained in the polymerized form in the cured layer, that is, the above-described polymerized unit, which can mean a state where the liquid crystal compound is polymerized to form skeletons of the liquid crystal polymer such as main chains or side chains in the cured layer.

The polymerizable liquid crystal compound can be a monofunctional or multifunctional polymerizable liquid crystal compound. Here, the monofunctional polymerizable liquid crystal compound can be a compound having one polymerizable functional group and the multifunctional polymerizable liquid crystal compound can mean a compound containing two or more polymerizable functional groups. In one example, the polyfunctional polymerizable liquid crystal compound can comprise 2 to 10, 2 to 8, 2 to 6, 2 to 5, 2 to 4, 2 to 3, or 2 or 3 polymerizable functional groups.

It is known that a polymerizable liquid crystal composition prepared by combining such a polymerizable liquid crystal compound with other components such as an initiator, a stabilizer and/or a non-polymerizable liquid crystal compound is cured in a state where it is oriented on an alignment film to form the cured layer expressed with birefringence, and in the present application, the above-mentioned transmittance characteristics can be secured by controlling the properties of the polymerizable liquid crystal compound used in such a known process.

In one example, in order to secure the above-described transmittance characteristics, it is advantageous that the cured layer of the polymerizable liquid crystal composition comprising the reverse wavelength polymerizable liquid crystal compound is applied. Here, the reverse wavelength polymerizable liquid crystal compound means a polymerizable liquid crystal compound in which the liquid crystal layer (cured layer) formed by curing the polymerizable liquid crystal compound alone exhibits reverse wavelength dispersion characteristics, where the reverse wavelength characteristics mean the properties described Equation 6 above.

In the present application, among the reverse wavelength polymerizable liquid crystal compounds, particularly, a liquid crystal compound having R (450)/R (550) of Equation 6 in a range of 0.6 to 0.99 can be applied. In another example, R (450)/R (550) of the reverse dispersion polymerizable liquid crystal compound can be 0.61 or more, 0.62 or more, 0.63 or more, 0.64 or more, 0.65 or more, 0.66 or more, 0.67 or more, 0.69 or more, 0.70 or more, 0.71 or more, 0.72 or more, 0.73 or more, 0.74 or more, 0.75 or more, 0.76 or more, 0.77 or more, 0.78 or more, 0.79 or more, 0.80 or more, 0.81 or more, 0.82 or more, 0.83 or more, 0.84 or more, 0.85 or more, 0.86 or more, 0.87 or more, 0.88 or more, 0.89 or more, or 0.90 or more. In another example, the R (450)/R (550) can be 0.98 or less, 0.97 or less, 0.96 or less, 0.95 or less, 0.94 or less, 0.93 or less, 0.92 or less, 0.91 or less, 0.90 or less, 0.89 or less, 0.88 or less, 0.87 or less, 0.86 or less, or 0.85 or less. Also, the reverse wavelength polymerizable liquid crystal compound can have R (650)/R (550) of Equation 6 in a range of 1.00 to 1.19. The R (650)/R (550) can be 1.18 or less, 1.17 or less, 1.16 or less, 1.15 or less, 1.14 or less, 1.13 or less, 1.12 or less, 1.11 or less, 1.1 or less, or 0.08 or less or so. In another example, the R (650)/R (550) can be 1.01 or more, 1.02 or more, 1.03 or more, 1.04 or more, 1.05 or more, 1.06 or more, 1.07 or more, 1.08 or more, or 1.09 or more or so. Among various known polymerizable liquid crystal compounds, particularly, in the case of the polymerizable liquid crystal compounds that the value of R (450)/R (550) is in the above-mentioned range, the present inventors have confirmed that the above-described transmittance characteristics are effectively satisfied by red shift of the UV absorption wavelength region, when it is combined with the normal dispersion polymerizable liquid crystal compound, as described below. In one example, the R (450)/R (550) can also be 0.6 or more, 0.61 or more, 0.62 or more, 0.63 or more, 0.64 or more, 0.65 or more, 0.66 or more, 0.67 or more, 0.68 or more, 0.69 or more, 0.70 or more, 0.71 or more, 0.72 or more, 0.73 or more, 0.74 or more, 0.75 or more, 0.76 or more, 0.77 or more, or 0.78 or more.

It is determined that this phenomenon is due to the inherent molecular structure of the reverse wavelength polymerizable liquid crystal compound designed to have R (450)/R (550) in the above range.

That is, the birefringence of the polymerizable liquid crystal compound is known to be mainly determined by a molecular conjugation structure, differential oscillator strength and order parameters, and the like, and in order for the polymerizable liquid crystal compound to exhibit high birefringence, large electron density in the direction of the main axis is required, and thus most of the polymerizable liquid crystal compounds have a highly conjugated shape in the long axis direction.

However, in order for the polymerizable liquid crystal compound to exhibit the reverse dispersion property, it is necessary to adjust the birefringence between the long axis and the axis perpendicular thereto, and accordingly, the polymerizable liquid crystal compound designed to have the reverse dispersion property has mostly a molecular shape in the form of T or H and simultaneously is a shape that the main axis (long axis) has a large phase difference and a small dispersion value, and the axis perpendicular thereto has a small phase difference and a large dispersion value.

However, since the electronic transition ($\pi \rightarrow \pi^*$) that absorbs light in the range of 180 nm to 400 nm as the ultraviolet region shifts to a longer wavelength as the conjugation length becomes longer, the polymerizable liquid crystal compound designed to have the reverse dispersion characteristic highly conjugates the negative birefringent portion to cause a red shift phenomenon in which the ultraviolet absorption wavelength region is shifted to a longer wavelength.

The present inventors have confirmed that among the reverse wavelength polymerizable liquid crystal compounds having the above characteristics, particularly, the polymerizable liquid crystal compound designed so that the range of R (450)/R (550) is in the above-mentioned range exhibits the appropriate range of red shift capable of satisfying the transmittance characteristics required in the present application.

In particular, in the case of the reverse dispersion polymerizable liquid crystal compound having the following structure, the present inventors have confirmed that while it exhibits the desired ultraviolet blocking ability when it has been mixed with the normal dispersion polymerizable liquid crystal compound, its phase difference properties (R (450)/R (550) and R (650)/R (550)) can also be effectively designed according to the purpose.

[Formula 1]

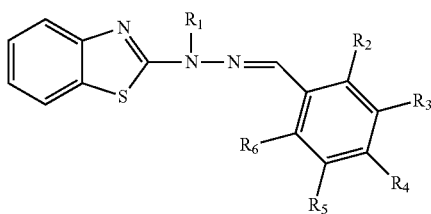

In Formula 1, $R_1$ is a substituent of the following Formula 2 or 3, and $R_2$ to $R_6$ are each independently hydrogen, an alkyl group, an alkoxy group, a cyano group, a substituent of the following Formula 4 or a substituent of the following Formula 5. Here, at least two or more or two of $R_2$ to $R_6$ are also substituents of the following Formula 4 or substituents of the following Formula 5.

For example, in Formula 1, any one of $R_2$ and $R_3$ and any one of $R_5$ and $R_6$ can be a substituent of the following Formula 4 or 5.

$$-A_1-L_1-Cyc-A_2-L_2-P \quad \text{[Formula 2]}$$

In Formula 2, $A_1$ and $A_2$ are each independently an oxygen atom or a single bond, $L_1$ and $L_2$ are each independently —C(=O)—O—, —O—C(=O)— or an alkylene group, Cyc is an arylene group or a cycloalkylene group, and P is a polymerizable functional group.

$$-L_3+\!\!\left[O-L_4\right]_{\!n}\!\!-P \quad \text{[Formula 3]}$$

In Formula 3, $L_3$ and $L_4$ are each an alkylene group, n is a number in a range of 1 to 4, and P is a polymerizable functional group or a hydrogen atom.

$$-A_3-L_5-Cyc-A_4-L_6-P \quad \text{[Formula 4]}$$

In Formula 4, $A_3$ and $A_4$ are an oxygen atom, an alkylene group or a single bond, $L_5$ and $L_6$ are each independently —C(=O)—O—, —O—C(=O)— or an alkylene group, Cyc is an arylene group, and P is a polymerizable functional group.

$$-A_5-L_7-Cy_1-A_6-L_8-Cy_2-A_7-L_9-P \quad \text{[Formula 5]}$$

In Formula 5, $A_5$, $A_6$ and $A_7$ are each independently an oxygen atom or a single bond, $L_7$, $L_8$ and $L_9$ are each independently —C(=O)—O—, —O—C(=O)— or an alkylene group, Cy1 is a cycloalkylene group, Cy2 is an arylene group, and P is a polymerizable functional group.

In Formulas 1 to 5 above, the term single bond is a case where there is no separate atom at the corresponding site, and for example, if $A_2$ in Formula 2 is a single bond, there is no separate atom in $A_2$ and a structure in which Cyc is directly connected to $L_2$ can be implemented.

In Formulas 1 to 5 above, the term alkyl group, alkoxy group or alkylene group can be a linear or branched alkyl group, alkoxy group or alkylene group, having 1 to 20 carbon atoms, 1 to 16 carbon atoms, 1 to 12 carbon atoms, 1 to 8 carbon atoms, or 1 to 4 carbon atoms, which can optionally be substituted by one or more substituents.

Also, in Formulas 1 to 5 above, the arylene group can be an arylene group having 6 to 12 carbon atoms or can be a phenylene group.

Furthermore, in Formulas 1 to 5 above, the cycloalkylene group can be a cycloalkylene group having 3 to 12 carbon atoms or 3 to 9 carbon atoms, or can be a cyclohexylene group.

In the substituents of Formula 2, $A_1$ can be a single bond, $L_1$ can be —C(=O)—O— or —O—C(=O)—, $A_2$ can be an oxygen atom, and $L_2$ can be an alkylene group having 3 or more, 4 or more, or 5 or more carbon atoms. The carbon number of the alkylene group in $L_2$ can be 12 or less, or 8 or less.

In one example of Formula 3 above, $L_3$ and $L_4$ can each independently be an alkylene group having 1 to 4 carbon atoms, n can be a number in a range of 1 to 3 or a number in a range of 1 to 2, or can be 2, and P can be a polymerizable functional group. Also, in this case, when the number of units of [O-$L_4$] in Formula 3 is 2 or more, the carbon number of the alkylene group of $L_4$ in each unit can be the same or different.

Also, in another example of Formula 3 above, $L_3$ and $L_4$ can each independently be an alkylene group having 1 to 4 carbon atoms, n can be a number in a range of 1 to 3 or a number in a range of 1 to 2, or can be 2, and P can be a hydrogen atom. Furthermore, in this case, when the number of units of [O-$L_4$] in Formula 3 is 2 or more, the carbon number of the alkylene group of $L_4$ in each unit can be the same or different.

In Formula 4, $A_3$ can be a single bond or can be an alkylene group having 1 to 4 carbon atoms, $L_5$ can be —C(=O)—O— or —O—C(=O)—, $A_4$ can be an oxygen atom, $L_6$ can be an alkylene group having 3 or more, 4 or more, or 5 or more carbon atoms. The carbon number of the alkylene group in $L_6$ can be 12 or less or 8 or less.

In Formula 5, $A_5$ can be an oxygen atom, $L_7$ can be an alkylene group having 1 to 4 carbon atoms, $A_6$ can be a single bond, $L_8$ can be —C(=O)—O— or —O—C(=O)—, $A_7$ can be an oxygen atom, and $L_9$ can be an alkylene group having 3 or more, 4 or more, or 5 or more carbon atoms. The carbon number of the alkylene group in $L_9$ can be 12 or less, or 8 or less.

The present inventors have confirmed that such a polymerizable liquid crystal compound can effectively satisfy the desired physical properties by a unique T type structure and a conjugated structure realized by centering on N—N bonds.

In the above formulas, the kind of the polymerizable functional group is not particularly limited, which can be, for example, an acryloyl group, a methacryloyl group, an acryloyloxy group or a methacryloyloxy group.

In one example, it can be advantageous that as the reverse dispersion polymerizable liquid crystal compound, a compound, wherein, in Formula 1 above, $R_1$ is a substituent of Formula 3 above, and at least two or more or two of $R_2$ to $R_6$ are substituents of Formula 5 above, is used.

If necessary, a liquid crystal compound that $R_1$ in Formula 1 above is a substituent of Formula 3 above, wherein P is a polymerizable functional group, and a liquid crystal compound that $R_1$ in Formula 1 above is a substituent of Formula 3 above, wherein P is a hydrogen atom, can be mixed and used, and in this case, the mixing ratio is determined according to the desired reverse wavelength characteristics (R (450)/R (550) and/or R (650)/R (550)), which is not particularly limited.

The polymerized units of the reverse wavelength polymerizable liquid crystal compound can be contained in the cured layer (liquid crystal layer) in a ratio of 40 wt % or more based on the weight of the polymerized units of the entire polymerizable liquid crystal compound. In another example, the ratio can also be about 45 wt % or more, 50 wt % or more, 55 wt % or more, 60 wt % or more, 65 wt % or more, 70 wt % or more, 75 wt % or more, 80 wt % or more, 85 wt % or more, 90 wt % or more, or 95 wt % or more. The phase difference layer (liquid crystal layer) can contain only polymerized units of the liquid crystal compound of the Formula 1 above as the polymerizable liquid crystal compound, but from the viewpoint of realization of appropriate physical properties, it is advantageous that the normal dispersion polymerizable liquid crystal compound to be described below is contained together. Accordingly, the ratio can be 100 wt % or less or less than 100 wt %.

The polymerizable liquid crystal composition and/or the cured layer (liquid crystal layer) can further comprise, in addition to the reverse dispersion polymerizable liquid crystal compound, a polymerizable liquid crystal compound in which in Equation 1, R (450)/R (550) is in a range of 1.04 to 1.25, 1.04 to 1.15 or 1.06 to 1.15 (hereinafter, normal dispersion polymerizable liquid crystal compound). The application of the reverse dispersion polymerizable liquid crystal compound having the above-mentioned R (450)/R (550) is advantageous in that the cured layer (liquid crystal layer) exhibits the desired transmittance characteristics, but it is disadvantageous that as the value of R (450)/R (550) is somewhat low, the cured layer (liquid crystal layer) exhibits a reverse dispersion characteristic as a whole. Therefore, in order to overcome this disadvantage, the polymerizable liquid crystal compound having the R (450)/R (550) value in the above range can be added in the polymerizable liquid crystal composition and/or the cured layer to control the overall optical properties. The normal dispersion liquid crystal compound can have R (650)/R (550) of Equation 6 in a range of about 0.8 to 0.99, about 0.85 to 0.99, about 0.9 to 0.99, or about 0.91 to 0.99.

Such normal dispersion polymerizable liquid crystal compounds are variously known, and for example, polymerizable liquid crystal compounds known in Korean Patent No. 1729819, Korean Patent No. 1640670, Korean Patent No. 1557202, Korean Patent No. 1472187, Korean Patent No. 1460862, Korean Patent No. 1191124, Korean Patent No. 1191125 and/or Korean Patent No. 1191129 and the like can be used.

As such a normal dispersion polymerizable liquid crystal compound, various known materials can be used, but in order to secure the desired physical properties by complementing miscibility with the previously described reverse dispersion polymerizable liquid crystal compound or ultraviolet absorptivity of the reverse dispersion polymerizable liquid crystal compound, it can be advantageous to use a compound of Formula 6.

[Formula 6]

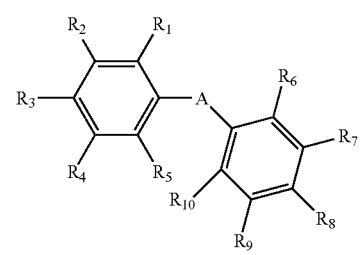

In Formula 6, A can be a single bond, —C(=O)O— or —OC(=O)—, and $R_1$ to $R_{10}$ can each independently be hydrogen, halogen, an alkyl group, an alkoxy group, an alkoxycarbonyl group, a cyano group, a nitro group or a substituent of Formula 7 below. Also, in another example, two neighboring substituents of $R_1$ to $R_5$ or two neighboring substituents of $R_6$ to $R_{10}$ in the structure can be bonded to each other to constitute a benzene ring substituted with -L-A-P. For example, when two neighboring substituents of $R_1$ to $R_5$ form benzene substituted with -L-A-P, a naphthalene structure substituted with -L-A-P can be realized on the left side based on A in Formula 6 above, and when two neighboring substituents of $R_6$ to $R_{10}$ form benzene substituted with -L-A-P, a naphthalene structure substituted with -L-A-P can be realized on the right side based on A in Formula 6 above. Here, L can be —C(=O)O—, —OC(=O)— or —OC(=O)O—, A can be an alkylene group, and P can be a polymerizable functional group. Here, the alkylene of A can be an alkylene group having 1 or more, 2 or more, 3 or more, or 4 or more carbon atoms, and the carbon number of the alkylene group can be 20 or less, 16 or less, 12 or less, or 8 or less. Also, here, the polymerizable functional group P can be an acryloyl group, a methacryloyl group, an acryloyloxy group or a methacryloyloxy group. Here, when two neighboring substituents of $R_1$ to R5 or two neighboring substituents of $R_6$ to $R_{10}$ are bonded to each other to constitute the benzene ring, the remaining substituents can be hydrogen, halogen, an alkyl group, an alkoxy group, an alkoxycarbonyl group, a cyano group or a nitro group, as described above.

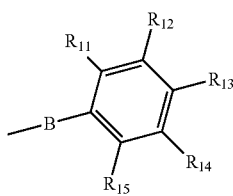

[Formula 7]

In Formula 7, B can be a single bond, —C(=O)O— or —OC(=O)—, and $R_{11}$ to $R_{15}$ can each independently be hydrogen, halogen, an alkyl group, an alkoxy group, an alkoxycarbonyl group, a cyano group, a nitro group or the -L-A-P, or two neighboring substituents of $R_{11}$ to $R_{15}$ can be bonded to each other to constitute a benzene ring substituted with -L-A-P. In this case, the structure of Formula 7 has a naphthalene structure substituted with -L-A-P. Here, when two neighboring substituents of $R_{11}$ to $R_{15}$ are bonded to each other to constitute the benzene ring, the remaining substituents can be hydrogen, halogen, an alkyl group, an alkoxy group, an alkoxycarbonyl group, a cyano group or a nitro group, as described above.

The meaning of the single bond in Formulas 6 and 7 above is the same as the case of Formulas 1 to 5 above, and the meanings of the alkyl group and the alkoxy group are also the same as the case of Formulas 1 to 5 above.

In one example, as $R_2$ and $R_3$ or $R_3$ and $R_4$ in Formula 6 above form benzene substituted with the -L-A-P, a compound in which the left side of A in Formula 6 above forms a naphthalene structure can be used as the normal dispersion polymerizable liquid crystal compound.

As the normal dispersion polymerizable liquid crystal compound, a compound in which any one of $R_7$ to $R_9$ in Formula 6 above, for example, $R_8$ is Formula 7 above can also be used. In this case, as $R_{12}$ and $R_{13}$ or $R_{13}$ and $R_{14}$ in Formula 7 above form benzene substituted with the -L-A-P, a compound in which the right side of B in Formula 7 above forms a naphthalene structure can be used.

The ratio of such a normal dispersion polymerizable liquid crystal compound in the cured layer (liquid crystal layer) is not particularly limited, as long as while the transmittance characteristic of the cured layer (liquid crystal layer) is maintained in the desired range, the optical properties such as the R (450)/R (550) value of the entire cured layer (liquid crystal layer) can be maintained in the desired range. For example, the normal dispersion polymerizable liquid crystal compound can be contained in a ratio of 0 to 60 wt % or a ratio of more than 0 wt % and 60 wt % or less. In another example, the ratio can also be about 55 wt % or less, 50 wt % or less, 45 wt % or less, 40 wt % or less, 35 wt % or less, 30 wt % or less, 25 wt % or less, 20 wt % or less, 15 wt % or less, 10 wt % or less, or 5 wt % or less or so. Within this range, the cured layer (liquid crystal layer) can exhibit suitable reverse dispersion characteristics and transmittance characteristics. Therefore, the ratio of the normal dispersion polymerizable liquid crystal compound in the polymerizable liquid crystal composition can be within a range in which the normal dispersion polymerizable liquid crystal compound in the formed cured layer can be present in the above-mentioned range.

The cured layer (liquid crystal layer) can comprise polymerized units of a polymerizable liquid crystal compound having tri-functionality or more, for example, a polymerizable liquid crystal compound having 3 to 10, 3 to 8, 3 to 6, 3 to 5, 3 to 4, or 3 polymerizable functional groups. Such a polymerizable liquid crystal compound having tri-functionality or more can be the above-mentioned reverse dispersion or normal dispersion polymerizable liquid crystal compound. The ratio of polymerized units of the polymerizable liquid crystal compound in the cured layer (liquid crystal layer) is not particularly limited, but it can be, for example, 30 wt % or more, or 40 wt % or more and can be100 wt % or less, or can be less than 100 wt %. The cured layer (liquid crystal layer) comprising polymerized units of the polymerizable liquid crystal compound having tri-functionality or more in such a ratio can exhibit more excellent durability.

In the cured layer (liquid crystal layer) of the polymerizable liquid crystal composition comprising the polymerizable liquid crystal compound as described above, the conversion ratio of the polymerizable liquid crystal compound, that is, the ratio of the polymerizable liquid crystal compound converted from the initial monomer state into the polymerized state can be, for example, 50 wt % to 100 wt % or so. In another example, the conversion ratio can be about 60 to 100 wt % or about 70 to 100 wt % or so. At such a conversion ratio, the cured layer (liquid crystal layer) can exhibit more excellent durability.

In particular, since the phase difference layer of the present application realizes the desired ultraviolet absorbing ability through application of normal dispersion and reverse dispersion polymerizable liquid crystal compounds having a specific structure without using an ultraviolet absorber or a light stabilizer, as described above, it can exhibit excellent durability.

For example, the phase difference layer can have an absolute value of the phase difference change ratio according to the following equation A of about 17% or less, about 16.5% or less, about 16% or less, or about 15.5% or less. In another example, the phase difference change ratio can be about 0% or more, 2% or more, 4% or more, 6% or more, 8% or more, 10% or more, 12% or more, or 14% or more.

Phase difference change ratio=100×(Ra−Ri)/Ri    [Equation A]

In Equation A, Ri is the initial in-plane phase difference of the phase difference layer for a wavelength of 550 nm, and Ra is the in-plane phase difference of the phase difference layer for a wavelength of 550 nm after an endurance condition.

Here, the endurance condition is to maintain the phase difference layer at 85° C., and specifically, the phase difference change ratio can be measured by the method disclosed in the following examples. Here, the holding time at the endurance condition can be 50 hours or more, 100 hours or more, 150 hours or more, 200 hours or more, or 250 hours or more. In another example, the holding time can also be about 300 hours or less.

The circularly polarizing plate of the present application can have various other structures as long as the polarizer and the phase difference layer are basically included.

For example, the circularly polarizing plate can comprise an additional layer (hereinafter, outer layer) laminated on the opposite surface of the polarizer facing the phase difference layer. FIG. 3 is an example of a case where the outer layer (301) is formed on the upper part of the polarizer (101).

As the type of the outer layer, a polarizer protective film, a hard coating layer, a phase difference film, an antireflection layer or a liquid crystal coating layer, and the like can be exemplified, without being limited thereto. The specific type of each constitution used as the outer layer is not particularly limited, and for example, various kinds of films used for constituting an optical film such as a polarizing plate in the industry can be used without limitation.

For example, the outer layer can be an optical film having a planar phase difference of 10 nm or less for a wavelength of 550 nm. The optical film can be a protective film of the polarizer. As the protective film, various films known in the industry can be applied.

The outer layer can also be a retardation layer having a quarter-wave phase delay characteristic. Such a retardation layer can be configured by using a phase difference film or a liquid crystal coating layer among the above-mentioned outer layers. Therefore, the circularly polarizing plate can further comprise an optical film (retardation layer) laminated on the opposite surface of the polarizer facing the phase difference layer and having a planar phase difference in a range of 90 nm to 300 nm for a wavelength of 550 nm. In another example, the planar phase difference of the retardation layer can be 100 nm or more, 105 nm or more, 110 nm or more, 115 nm or more, 120 nm or more, 125 nm or more, or 130 nm or more. Also, the planar phase difference can be 290 nm or less, 280 nm or less, 270 nm or less, 260 nm or less, 250 nm or less, 240 nm or less, 230 nm or less, 220 nm or less, 210 nm or less, 200 nm or less, 190 nm or less, 180 nm or less, 170 nm or less, 160 nm or less, 150 nm or less, or 145 nm or less.

The above-mentioned outer layer can be a single layer or a multilayer structure. An example of the single layer structure can be exemplified by a single layer structure of the polarizer protective film or a single layer structure of the phase difference film, which is the retardation layer having the quarter-wave phase delay characteristic, and the like, and the multilayer structure can be exemplified by a structure in which a hard coating layer, a liquid crystal coating layer having a quarter-wave phase delay characteristic and/or an antireflection layer are formed on the polarizer protective film and/or the phase difference film, and the hard coating layer, the liquid crystal having a quarter-wave phase delay characteristic and the antireflection layer, and the like can be present as any one layer of them, or can also be present as a multilayer of two or more layers.

The circularly polarizing plate can further comprise an additional layer (hereinafter, lower layer) laminated on the opposite side of the surface of the phase difference layer facing the polarizer. FIG. 4 is an example of a case where the lower layer (401) is formed on the upper part of the phase difference layer (102). In the same case as FIG. 4, the same outer layer (301) as FIG. 3 can also be added. For example, as in FIG. 4, in the state where the lower layer (401) is present, an outer layer such as a hard coating layer or a low reflection layer can exist on the outer side of the polarizer (101), and a protective film can also exist on one side or both sides of the polarizer (101).

The type of the lower layer can be exemplified by a retardation layer, or a pressure-sensitive adhesive layer or an adhesive layer for attaching the circularly polarizing plate to another element, or a protective film or a release film for protecting the pressure-sensitive adhesive layer or the adhesive layer.

When a retardation layer is used as the lower layer, the layer satisfying the refractive index relationship of the following equation 7 or 8 can be applied. The addition of such a layer allows the circularly polarizing plate to exhibit the desired properties for the light incident in the oblique direction.

$$nx=ny<nz \quad \text{[Equation 7]}$$

$$nx>ny \text{ and } nz>ny \quad \text{[Equation 8]}$$

In Equations 7 and 8 above, nx, ny and nz are as defined in Equations 1 to 3 above.

The circularly polarizing plate can further comprise an optical film, as a retardation layer which is the lower layer, present on the lower part of the phase difference layer and having thickness direction phase difference in a range of 10 to 400 nm. The optical film can be a retardation layer satisfying the refractive index relationship of Equation 7 or 8 above.

In another example, the upper limit of the thickness direction phase difference of the optical film can be 370 nm or less, 350 nm or less, 330 nm or less, 300 nm or less, 270 nm, 250 nm, 240 nm, 230 nm, 220 nm, 200 nm, 190 nm, 180 nm, 170 nm, 160 nm, 155 nm, 150 nm, 130 nm, 120 nm, 110 nm, 100 nm, 80 nm or 70 nm. Also, in another example, the lower limit of the thickness direction phase difference of the optical film can be 5 nm, 10 nm, 20 nm, 40 nm, 50 nm, 90 nm, 100 nm, 110 nm, 120 nm or 150 nm. It is possible to provide a circularly polarizing plate having excellent reflection characteristics and luminosity characteristics, in particular, reflection characteristics and visual sensitivity characteristics at an oblique angle, by adjusting the thickness direction phase difference of the optical film as above.

When the optical film is an optical film satisfying Equation 8 above, the planar phase difference thereof can be, for example, more than 0 nm, and 300 nm or less, 290 nm or less, 280 nm or less, 270 nm or less, 260 nm or less, 250 nm or less, 240 nm or less, 230 nm or less, 220 nm or less, 210 nm or less, 200 nm or less, 190 nm or less, 180 nm or less, 170 nm or less, 160 nm or less, 150 nm or less, 140 nm or less, 130 nm or less, 120 nm or less, 110 nm or less, 100 nm or less, 90 nm or less, 80 nm or less, 70 nm or less, 60 nm or less, 50 nm or less, 40 nm or less, 30 nm or less, 20 nm or less, or 10 nm or less.

Furthermore, when the optical film is an optical film satisfying Equation 8 above, the optical film can be arranged such that its slow axis is perpendicular or horizontal to the absorption axis of the polarizer. In this specification, the term vertical, orthogonal, horizontal or parallel means substantially vertical, orthogonal, horizontal or parallel in a range that does not impair the desired effect. Therefore, the terms can each include, for example, an error within ±15 degrees, within ±10 degrees, within ±5 degrees, or within ±3 degrees.

In another example, when the optical film is an optical film satisfying Equation 8 above, it can also be arranged such that its slow axis can form an angle in a range of about 30 to 60 degrees with the absorption axis of the polarizer. In another example, the angle can be 35 degrees or more, or 40 degrees or more, and also can be 55 degrees or less, or 50 degrees or less.

In the circularly polarizing plate, a separate layer may or may not exist between the polarizer and the phase difference layer.

Here, the case that no separate layer exists between the polarizer and the phase difference layer is the case that the polarizer and the phase difference layer are directly attached, where in this case, other layers may not be present except for a layer for bonding the polarizer and the phase difference layer, for example, a pressure-sensitive adhesive layer, an adhesive layer and/or a primer layer, and the like.

In addition, even when a separate layer exists or does not exist between the polarizer and the phase difference layer, no birefringent layer can exist at least between the polarizer and the phase difference layer. In this case, the birefringent layer means a layer having at least one of the planar phase difference and the thickness direction phase difference of 10 nm or more.

FIG. 5 is an example of a case where a separate layer (middle layer) (501) exists between the polarizer (101) and the phase difference layer (102). The middle layer can be exemplified by the polarizer protective film or retardation layer as described above. Although not shown even in the structure of FIG. 5, the outer layer (301) of the structure of FIG. 3 and/or the lower layer (401) of the structure of FIG. 4 can also be present.

For example, the circularly polarizing plate can further comprise an optical film present between the polarizer and the phase difference layer, and having a planar phase difference of 5 nm or less for a wavelength of 550 nm and a thickness direction phase difference for a wavelength of 550 nm in a range of −60 nm to 0 nm, where this optical film can be, for example, a protective film of a polarizer.

In another example, the circularly polarizing plate can further comprise an optical film present between the polarizer and the phase difference layer and having a planar phase difference for a wavelength of 550 nm of 10 nm or less and a thickness direction phase difference for a wavelength of 550 nm in a range of 40 nm to 400 nm. Such an optical film can be a retardation layer, which can be, for example, a layer satisfying any one of refractive index relationships of Equations 1 to 3, 7 and 8, or can be a spray-oriented liquid crystal cured layer, or a tilt-oriented liquid crystal cured layer.

In one example, the circularly polarizing plate can further comprise an optically anisotropic layer present between the polarizer and the phase difference layer and having a retardation layer which has Nz of −4.0 or less in the following equation 9 or satisfies the following equation 10.

$$Nz=(nx-nz)/(nx-ny) \quad \text{[Equation 9]}$$

$$nx=ny<nz \quad \text{[Equation 2]}$$

In Equations 9 and 10, nx is the refractive index in the slow axis direction of the retardation layer, ny is the refractive index in the fast axis direction of the retardation layer, and nz is the refractive index in the thickness direction of the retardation layer.

Also, in this case, the optically anisotropic layer can further comprise a retardation layer that the Nz value in Equation 9 is in the range of 0.8 to 1.2, and the in-plane slow axis is parallel or orthogonal to the absorption axis of the polarizer.

For example, the retardation layer having Nz of −4.0 or less in Equation 9 or satisfying Equation 10 is adjacent to the polarizer as compared with the retardation layer having the Nz value of Equation 9 above in the range of 0.8 to 1.2, and the in-plane slow axis of the retardation layer having the Nz value of Equation 9 above in the range of 0.8 to 1.2 can be arranged to be parallel to the absorption axis of the polarizer.

In addition, the retardation layer having the Nz value of Equation 9 above in the range of 0.8 to 1.2 is adjacent to the polarizer as compared with the retardation layer having the Nz in Equation 9 above of −4.0 or less or satisfying Equation 10, and the in-plane slow axis of the retardation layer having the Nz value of Equation 9 above in the range of 0.8 to 1.2 can also be orthogonal to the absorption axis of the polarizer.

Furthermore, the retardation layer having the Nz value of Equation 9 in the range of 0.8 to 1.2 is adjacent to the polarizer as compared with the retardation layer having the Nz of −4.0 or less in Equation 9 above or satisfying Equation 10, and the in-plane slow axis of the retardation layer having the Nz value of Equation 9 above in the range of 0.8 to 1.2 can also be parallel to the absorption axis of the polarizer.

In addition, the retardation layer having Nz of −4.0 or less in Equation 9 above or satisfying Equation 10 is adjacent to the polarizer as compared with the retardation layer having the Nz value of Equation 9 above in the range of 0.8 to 1.2, and the in-plane slow axis of the retardation layer having the Nz value of Equation 9 above in the range of 0.8 to 1.2 can also be arranged to be orthogonal to the absorption axis of the polarizer.

In this case, the thickness direction phase difference of the retardation layer having the Nz of −4.0 or less in Equation 9 above or satisfying Equation 10 can be in a range of 30 nm to 200 nm, and the Nz value of Equation 9 above can be −4.0 or less.

In addition, the planar phase difference of the retardation layer having the Nz value of Equation 9 above in the range of 0.8 to 1.2 can be in a range of 30 nm to 180 nm for light having a wavelength of 550 nm.

In another example, the circularly polarizing plate can further comprise a retardation layer present between the polarizer and the phase difference layer and satisfying Equation 11 below.

$$nx>ny \text{ and } nz>ny \quad \text{[Equation 11]}$$

In Equation 11, nx is the refractive index in the slow axis direction of the retardation layer, ny is the refractive index in the fast axis direction of the retardation layer, and nz is the refractive index in the thickness direction of the retardation layer.

In this case, the planar phase difference of the retardation layer can be in a range of 70 to 200 nm, and the in-plane slow axis thereof can be parallel or orthogonal to the absorption axis of the polarizer. Also, the Nz of the retardation layer according to Equation 9 above can be in a range of −0.2 to 0.8.

In another example, the circularly polarizing plate can further comprise a retardation layer having a plurality of optical axes whose inclination angles vary along the thickness direction, for example, a spray-oriented liquid crystal cued layer between the polarizer and the phase difference layer.

The projection of all the optical axes of the retardation layer onto the plane can be parallel or orthogonal to the absorption axis of the polarizer.

When the retardation layer is a liquid crystal cured layer, the cured layer can comprise a liquid crystal material having refractive index anisotropy of 0.03 to 0.2.

Also, the liquid crystal cured layer can comprise rod-shaped liquid crystal molecules or can include disk-shaped liquid crystal molecules.

In this case, the optical axis of the retardation layer can be gradually changing along the thickness direction of the retardation layer such that the inclination angle is 70 degrees to 90 degrees on one surface of the retardation layer and the inclination angle is 0 degrees to 20 degrees on the other surface facing it.

When the rod-shaped liquid crystal molecules are included, the optical axis can be gradually changing along the thickness direction such that the inclination angle of the optical axis of the retardation layer is 70 degrees to 90 degrees on both surfaces of the retardation layer, respectively and it is 0 degrees to 70 degrees in the middle portion in the thickness direction.

When the rod-shaped liquid crystal molecules are included, the optical axis can be gradually changing along the thickness direction such that the inclination angle of the optical axis of the retardation layer is 0 degrees to 20 degrees on both surfaces of the retardation layer, respectively and it is 40 degrees to 90 degrees in the middle portion in the thickness direction.

When the disk-shaped liquid crystal molecules are included, the optical axis can be gradually changing along the thickness direction such that the inclination angle of the optical axis of the retardation layer is 70 degrees to 90 degrees on both surfaces of the retardation layer, respectively and it is 0 degrees to 30 degrees in the middle portion in the thickness direction.

When the disk-shaped liquid crystal molecules are included, the optical axis can be gradually changing along the thickness direction such that the inclination angle of the optical axis of the retardation layer is 0 degrees to 20 degrees on both surfaces of the retardation layer, respectively and it is 20 degrees to 50 degrees in the middle portion in the thickness direction.

Also, in another example, the circularly polarizing plate can further comprise a retardation layer having an optical axis inclined uniformly along the thickness direction, for example, a tilt-oriented liquid crystal cured layer between the polarizer and the phase difference layer.

Here, the projection of the retardation layer onto the plane of the optical axis can be parallel to the absorption axis of the polarizer.

The retardation layer, which is a liquid crystal cured layer, can comprise liquid crystal molecules having refractive index anisotropy in a range of 0.03 to 0.2.

Also, the liquid crystal molecules can be rod-shaped liquid crystal molecules, for example, nematic liquid crystals.

In this case, the inclination angle of the optical axis of the retardation layer can be in a range of 25 degrees to 65 degrees, and the thickness can be in a range of 0.35 µm to 2.2 µm.

Furthermore, in another example, the inclination angle of the optical axis of the retardation layer can be in a range of 35 degrees to 50 degrees, and the thickness can be 0.4 µm to 2.2 µm.

In another example, the liquid crystal molecules can be disk-shaped liquid crystal molecules, for example, discotic liquid crystals.

In this case, the inclination angle of the optical axis of the retardation layer can be in a range of 10 degrees to 35 degrees, and the thickness can be in a range of 1 µm to 3 µm.

The present application is also directed to a display device. An exemplary display device can comprise the circularly polarizing plate.

The specific kind of the display device comprising the circularly polarizing plate is not particularly limited. The device can be, for example, a liquid crystal display such as a reflective type or semi-transmissive reflective type liquid crystal display, or can be an organic light emitting device or the like.

The arrangement type of the circularly polarizing plate in the display device is not particularly limited, and for example, a known type can be adopted. For example, in a reflective type liquid crystal display, the circularly polarizing plate can be used as any one circularly polarizing plate among the circularly polarizing plates of a liquid crystal panel for preventing reflection of external light and ensuring visibility.

In addition, when the circularly polarizing plate is applied to the organic light emitting device, the organic light emitting device comprises a reflective electrode, a transparent electrode, an organic layer interposed between the reflective electrode and the transparent electrode and having a light emitting layer, and the circularly polarizing plate, where the circularly polarizing plate can be present outside the reflective or transparent electrode and a phase difference film can be disposed closer to the reflective or transparent electrode than a polarizer.

Advantageous Effects

The present application can provide a circularly polarizing plate, which can be applied to a display device such as an organic light emitting display device to minimize blocking of light in the visible light region affecting image quality while blocking harmful ultraviolet rays appropriately and also has excellent durability.

BRIEF DESCRIPTION OF DRAWINGS

FIGS. 1 and 3 to 5 are schematic diagrams of exemplary circularly polarizing plate structures.

FIG. 2 is a diagram for explaining an axial relationship.

FIGS. 6 and 7 are graphs showing transmittance of an example or a comparative example.

FIGS. 8 to 13 are graphs showing changes in phase difference in examples or comparative examples.

EXPLANATION OF REFERENCE NUMERALS

101: polarizer
102: phase difference layer
100: phase difference layer, retardation layer, phase difference film, optical film
301: outer layer
401: lower layer
501: middle layer

EXAMPLES

Hereinafter, the present application will be described in detail by way of examples and comparative examples, but the scope of the present application is not limited by the following transmittance-variable device.

PREPARATION EXAMPLE 1

Preparation of Polymerizable Liquid Crystal Composition A

A polymerizable liquid crystal composition was prepared using LC1057 liquid crystals of BASF Corporation as a normal dispersion polymerizable liquid crystal compound and a liquid crystal compound of Formula A below as a reverse dispersion liquid crystal compound. The normal dispersion polymerizable liquid crystal compound has R (450)/R (550) in a level of about 1.09 to 1.11 or so and R (650)/R (550) in a level of about 0.93 to 0.95 or so, and the liquid crystal compound of Formula A has R (450)/R (550) in a level of about 0.84 to 0.86 or so and R (650)/R (550) in a level of about 1.01 to 1.03 or so. The R (450), R (550) and R (650) are in-plane phase differences for light having wavelengths of 450 nm, 550 nm and 650 nm, respectively, as measured with respect to a phase difference layer formed by using the normal dispersion polymerizable liquid crystal compound or the polymerizable liquid crystal compound of Formula A alone. The in-plane phase difference can be measured by a known method, and for example, it can be measured by a polarization measurement method using Axoscan (Axometrics), which is a birefringence meter. The method of forming the phase difference layer by using the polymerizable liquid crystal compounds alone is the same as that described in the following examples, except that the polymerizable liquid crystal compounds are applied alone. The normal dispersion polymerizable liquid crystal compound and the reverse dispersion polymerizable liquid crystal compound of Formula A were mixed in a weight ratio of approximately 94:6 to 95:5 (reverse dispersion polymerizable liquid crystal: normal dispersion polymerizable liquid crystal) and about 5 parts by weight of a radical photoinitiator (BASF, Irgacure 907) relative to 100 parts by weight of the total of the polymerizable liquid crystal compounds was combined in a solvent (cyclopentanone) to prepare a polymerizable liquid crystal composition A.

of potassium carbonate and 70 ml of N,N-dimethylformamide were added to the reaction vessel and the mixture was heated and stirred at 90° C. for 3 days. The reactant was poured into water, extracted with toluene and washed with a saline solution. Purification was performed by column chromatography (silica gel, toluene) and recrystallization (acetone/methanol) to obtain 7.7 g of a compound of Formula A5. 7.7 g of the compound of Formula A5, 150 ml of dichloromethane and 100 ml of trifluoroacetic acid were added to the reaction vessel and stirred. After the solvent was distilled off, the resulting solid was washed with water and dried to obtain 5.5 g of a compound of Formula A6.

Under a nitrogen atmosphere, 5.5 g of the compound of Formula A6, 6.9 g of a compound of Formula A7, 0.8 g of N,N-dimethylaminopyridine and 200 ml of dichloromethane were added to the reaction vessel. 4.1 g of diisopropylcarbodiimide was dripped while cooling with ice and the mixture was stirred at room temperature for 10 hours. After the precipitate was removed by filtration, the filtrate was washed successively with 1% hydrochloric acid, water and a saline solution. After performing recrystallization (dichloromethane/methanol), purification was performed by col-

[Formula A]

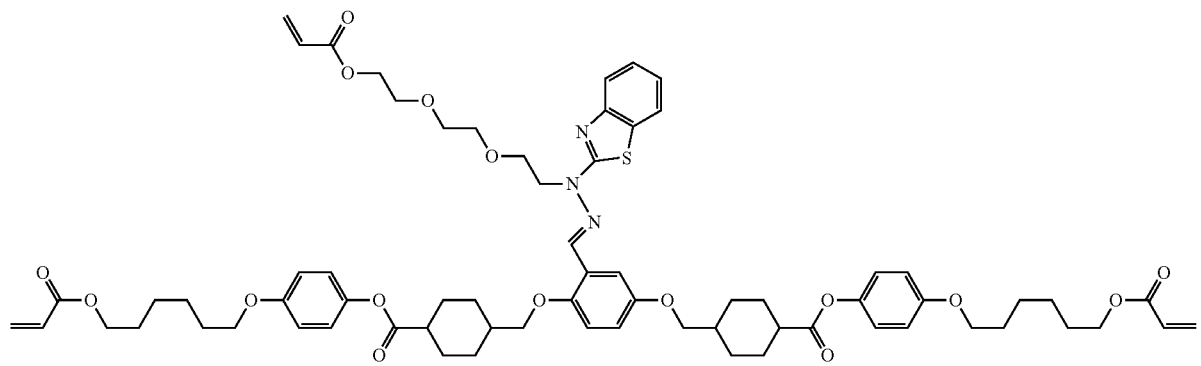

Here, the compound of Formula A was synthesized in the following manner. Under a nitrogen atmosphere, 17.7 g of a compound of Formula A1 below and 100 ml of tetrahydrofuran were placed in a reaction vessel. 103 ml of a 0.9 mol/L borane-tetrahydrofuran complex was dripped while cooling with ice and the mixture was stirred for 1 hour. After dripping 5% hydrochloric acid, the mixture was extracted with ethyl acetate and washed with a saline solution. The extract was dried over sodium sulfate and the solvent was distilled off to obtain 14.9 g of a compound of Formula A2 below. Under a nitrogen atmosphere, 14.9 g of the compound of Formula A2, 7.2 g of pyridine and 150 ml of dichloromethane were added to the reaction vessel. 8.8 g of methanesulfonyl chloride was dripped while cooling with ice and the mixture was stirred at room temperature for 3 hours. The reactant was poured into water, and washed sequentially with 5% hydrochloric acid and a saline solution. Purification was performed by column chromatography (silica gel, hexane/ethyl acetate) and recrystallization (acetone/hexane) to obtain 16.3 g of a compound of Formula A3 (in Formula A3 below, Ms is a methanesulfonyl group). Under a nitrogen atmosphere, 2.5 g of a compound of Formula A4, 10.6 g of the compound of Formula A3, 7.5 g umn chromatography (silica gel, dichloromethane) and recrystallization (dichloromethane/methanol) to obtain 8.4 g of a compound of Formula A8.

1.4 g of the compound of Formula A8, 0.35 g of 2-hydrazinobenzothiazole and 5 ml of tetrahydrofuran were added to a 30 ml three-necked flask, and the mixture was stirred at 25° C. for 9 hours. Then, 50 ml of water was added, and the mixture was extracted twice with 30 ml of ethyl acetate. The resulting organic phase was dried with sodium sulfate. After sodium sulfate was filtered off, the organic phase was concentrated under reduced pressure. The resulting residue was purified by silica gel column chromatography (hexane/ethyl acetate=2/1). The resulting crude product was subjected to reprecipitation using acetone/methanol. These crystals were filtered and dried to obtain 0.98 g of a compound of Formula A9. Subsequently, the hydrogen atom attached to the nitrogen atom of the compound of Formula A9 was substituted with a 2-[2-(2-acryloyloxyethoxy)ethoxy]ethyl group to obtain the compound of Formula A. NMR confirmatory results of the resulting compound of Formula A were described below.

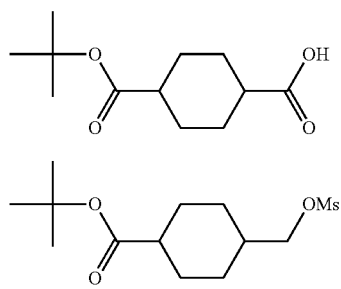
[Formula A1]

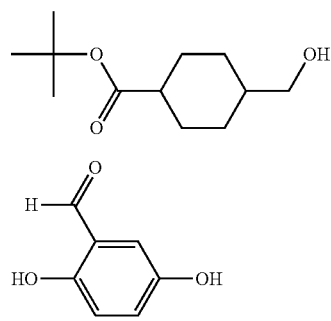
[Formula A2]

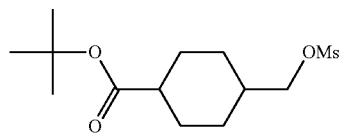
[Formula A3]

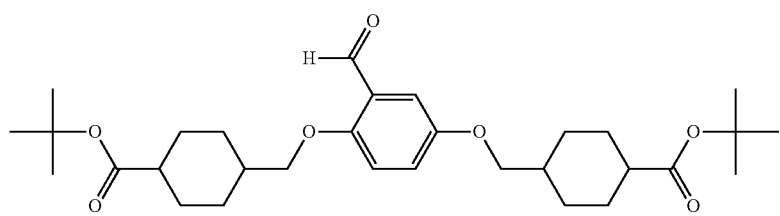
[Formula A4]

[Formula A5]

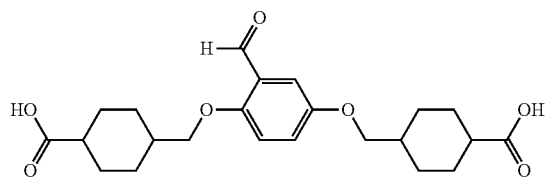
[Formula A6]

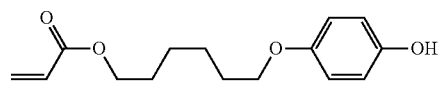
[Formula A7]

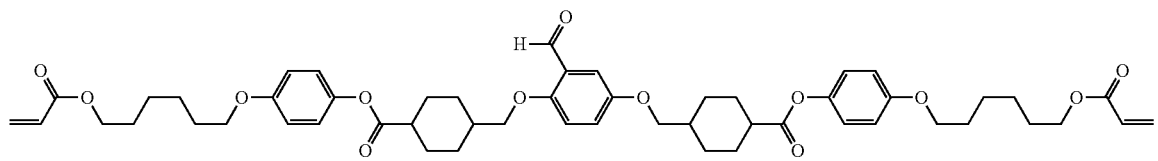
[Formula A8]

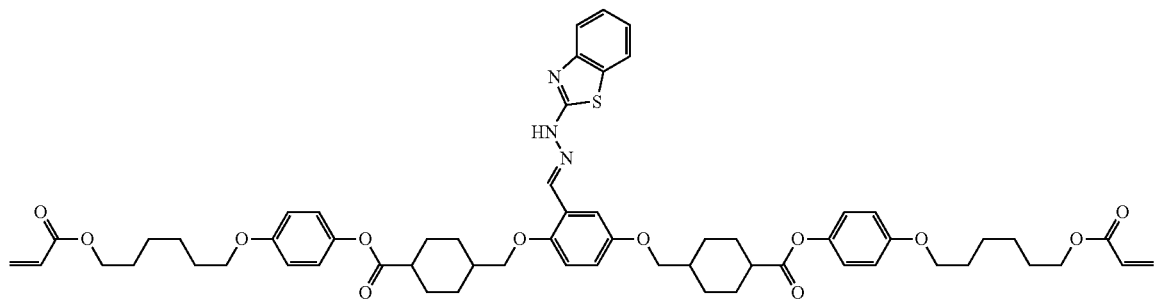
[Formula A9]

<NMR Results>

¹H NMR (CDCl₃) δ 1.19-1.29 (m, 4H), 1.41-1.82 (m, 22H), 1.91 (m, 2H), 2.08 (m, 4H), 2.24 (m, 4H), 2.53 (m, 2H), 3.62 (m, 3H), 3.67 (m, 2H), 3.84-3.90 (m, 5H), 3.94 (t, 4H), 4.15-4.19 (m, 6H), 4.53 (t, 2H), 5.76 (dd, 1H), 5.82 (dd, 2H), 6.08 (dd, 1H), 6.12 (dd, 2H), 6.37 (dd, 1H), 6.40 (dd, 2H), 6.84-6.90 (m, 6H), 6.95-6.98 (m, 4H), 7.14 (t, 1H), 7.32 (t, 1H), 7.53 (d, 1H), 7.65 (d, 1H), 7.69 (d, 1H), 8.34 (s, 1H) ppm.

PREPARATION EXAMPLE 2

Preparation of Polymerizable Liquid Crystal Composition B

A polymerizable liquid crystal composition B was prepared in the same manner as in Preparation Example 1, except that a liquid crystal compound of Formula B below was applied as the reverse dispersion polymerizable liquid crystal compound. The liquid crystal compound of Formula B has R (450)/R (550) in a level of about 0.81 to 0.83 or so and R (650)/R (550) in a level of about 1.01 to 1.03 or so. The R (450), R (550) and R (650) are in-plane phase differences for light having wavelengths of 450 nm, 550 nm and 650 nm, as measured with respect to a phase difference layer formed by using the polymerizable liquid crystal compound of Formula B alone.

Example 3, except that the reverse dispersion polymerizable liquid crystal compound of Formula A, the photoinitiator and the ultraviolet absorber were combined in a weight ratio of 20:1:0.6 (reverse dispersion polymerizable liquid crystal compound:photoinitiator:ultraviolet absorber).

EXAMPLE 1

Production of Phase Difference Layer

A photo-alignment film was formed on an NRT base film from FujiFilm. A known cinnamate series composition for

[Formula B]

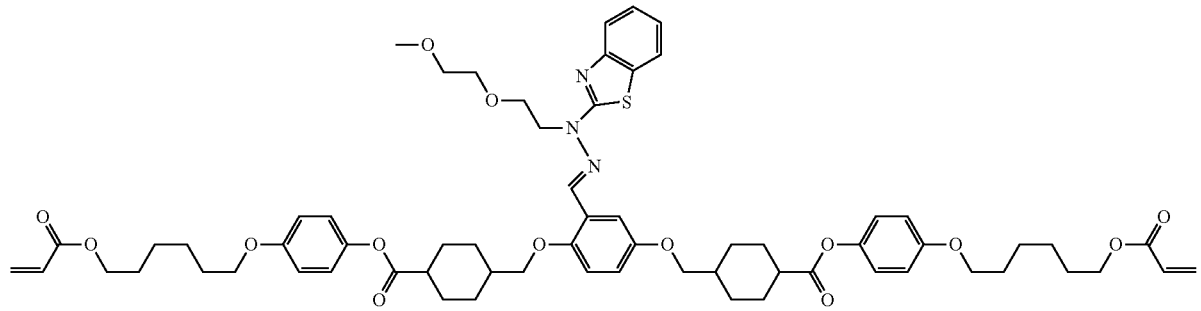

Here, the compound of the Formula B was obtained by obtaining a compound of Formula A9 below in the same manner as in Preparation Example 1 and then substituting the hydrogen atom attached to the nitrogen atom of the compound of Formula A9 with a 2-[2-(methoxyethoxy)] ethyl group. NMR confirmatory results of the resulting compound of Formula B were described below.

<NMR Results>

$^1$H NMR (CDCl$_3$) δ 1.22-1.28 (m, 4H), 1.44-1.47 (m, 8H), 1.60-1.82 (m, 12H), 1.90 (m, 2H), 2.07 (t, 4H), 2.24 (d, 4H), 2.53 (m, 2H), 3.30 (s, 3H), 3.50 (t, 2H), 3.66 (t, 2H), 3.85-3.89 (m, 6H), 3.93 (t, 4H), 4.17 (t, 4H), 4.53 (t, 2H), 5.82 (d, 2H), 6.13 (q, 2H), 6.40 (d, 2H), 6.83-6.90 (m, 6H), 6.95-6.98 (m, 4H), 7.14 (t, 1H), 7.32 (t, 1H), 7.52 (t, 1H), 7.67 (t, 2H), 8.33 (s, 1H) ppm.

PREPARATION EXAMPLE 3

Preparation of Polymerizable Liquid Crystal Composition C

A polymerizable liquid crystal composition was prepared by applying the reverse dispersion polymerizable liquid crystal compound of Formula A in Preparation Example 1 above, the same photoinitiator as that used in Preparation Example 1 and an ultraviolet absorber (Orient Chemical Industries, BONASORB UA-3912) having a maximum absorption wavelength range of about 380 to 390 nm as an ultraviolet absorber. The reverse dispersion polymerizable liquid crystal compound of Formula A, the photoinitiator and the ultraviolet absorber were combined in a solvent (cyclopentanone) in a weight ratio of 20:1:1 (reverse dispersion polymerizable liquid crystal compound:photoinitiator:ultraviolet absorber) to prepare a polymerizable liquid crystal composition C.

PREPARATION EXAMPLE 4

Preparation of Polymerizable Liquid Crystal Composition D

A polymerizable liquid crystal composition D was prepared in the same manner as in the case of Preparation forming a photo-alignment film was applied on the NRT base film to a thickness of about 100 nm and irradiated with linearly polarized ultraviolet rays at about 300 mW/cm$^2$ to form it. Subsequently, the polymerizable liquid crystal composition A was coated on the photo-alignment film to be a dry thickness of about 1 oriented along the lower alignment film, and then irradiated with ultraviolet rays at about 300 mW/cm$^2$ for about 10 seconds to form a phase difference layer. The in-plane phase difference of the phase difference layer for light having a wavelength of 550 nm was about 146.0 nm. The formed phase difference layer had R (450)/R (550) in a level of about 0.85 to 0.87 or so and R (650)/R (550) in a level of about 1.01 to 1.05 or so.

Production of Circularly Polarizing Plate

The produced phase difference layer was attached to one side of a known iodine PVA (poly(vinyl alcohol)) polarizer (LG Chemical Co., Ltd.) as a polarizer to produce a circularly polarizing plate. For attachment, a general ultraviolet curable adhesive used for lamination of an optical film was applied.

EXAMPLE 2

Production of Phase Difference Layer

A phase difference layer was formed in the same manner as in Example 1, except that the polymerizable liquid crystal composition B was applied instead of the polymerizable liquid crystal composition A. The in-plane phase difference of the phase difference layer for light having a wavelength of 550 nm was about 144.5 nm. The formed phase difference layer had R (450)/R (550) in a level of about 0.82 to 0.85 or so and R (650)/R (550) in a level of about 1.01 to 1.05 or so.

Production of Circularly Polarizing Plate

A circularly polarizing plate was produced in the same manner as in Example 1, using the produced phase difference layer.

COMPARATIVE EXAMPLE 1

Production of Phase Difference Layer

A phase difference layer was formed in the same manner as in Example 1, except that the polymerizable liquid crystal composition C was applied instead of the polymerizable liquid crystal composition A. The in-plane phase difference of the phase difference layer for light having a wavelength of 550 nm was about 131.7 nm. The formed phase difference layer had R (450)/R (550) in a level of about 0.84 to 0.86 or so and R (650)/R (550) in a level of about 1.01 to 1.03 or so.

Production of Circularly Polarizing Plate

A circularly polarizing plate was produced in the same manner as in Example 1, using the produced phase difference layer.

COMPARATIVE EXAMPLE 2

Production of Phase Difference Layer

A phase difference layer was formed in the same manner as in Example 1, except that the polymerizable liquid crystal composition D was applied instead of the polymerizable liquid crystal composition A. The in-plane phase difference of the phase difference layer for light having a wavelength of 550 nm was about 140.7 nm. The formed phase difference layer had R (450)/R (550) in a level of about 0.81 to 0.83 or so and R (650)/R (550) in a level of about 1.01 to 1.03 or so.

Production of Circularly Polarizing Plate

A circularly polarizing plate was produced in the same manner as in Example 1, using the produced phase difference layer.

Evaluation 1. Comparison of Ultraviolet Absorption Characteristics.

The ultraviolet absorption characteristics of each of the phase difference layers produced in Examples and Comparative Examples were compared. The ultraviolet absorption characteristics for each wavelength were evaluated for a specimen that an alignment film and a liquid crystal layer (phase difference layer) were sequentially formed on an NRT base material which does not exhibit any absorption peak in a wavelength region of 300 nm or more by a method shown in each of Examples and Comparative Examples by using N&K UV Spectrometer (HP). FIGS. 6 and 7 are measurement results for Example 1, respectively and FIGS. 8 and 9 are measurement results for Comparative Examples 1 and 2, respectively. The specific transmittance for each wavelength was summarized in Table 1 below.

TABLE 1

| | Transmittance (unit: %) | | | |
|---|---|---|---|---|
| | 385 nm | 390 nm | 395 nm | 400 nm |
| Example 1 | 1.7 | 3.7 | 10.4 | 27.0 |
| Example 2 | 1.7 | 3.8 | 10.5 | 27.2 |
| Comparative Example 1 | 0.5 | 0.9 | 2.6 | 7.0 |
| Comparative Example 2 | 0.7 | 1.6 | 4.3 | 11.6 |

From Table 1, it can be confirmed that the present application can secure superior ultraviolet blocking properties without applying an ultraviolet absorber.

Evaluation 2. Durability Evaluation.

Durability was evaluated for each of the phase difference layers produced in Examples and Comparative Examples. The durability was evaluated by maintaining each of the phase difference layers produced in Examples and Comparative Examples at a condition of about 85° C. (endurance condition) for 250 hours, and then comparing the in-plane phase difference (based on a wavelength of 550 nm) before maintaining the condition and the in-plane phase difference (based on a wavelength of 550 nm) after maintaining the condition. FIGS. 10 and 11 are measurement results for Example 1, respectively and FIGS. 12 and 13 are measurement results for Comparative Examples 1 and 2, respectively.

TABLE 2

| | In-plane phase difference (based on a wavelength of 550 nm) | | |
|---|---|---|---|
| | Before maintaining endurance condition | After maintaining endurance condition | Change amount |
| Example 1 | 146.0 nm | 123.8 nm | −15.2% |
| Example 2 | 144.5 nm | 123.8 nm | −14.8% |
| Comparative Example 1 | 131.7 nm | 101.7 nm | −22.8% |
| Comparative Example 2 | 140.7 nm | 113.6 nm | −19.3% |

From the results of Table 2, in the case of the phase difference layer according to the present application, it can be confirmed that it has excellent ultraviolet absorbing ability without using an ultraviolet absorber or a light stabilizer and also as a result, shows excellent results in terms of durability.

The invention claimed is:

1. A circularly polarizing plate comprising a polarizer; and a phase difference layer formed on one side of the polarizer, wherein the phase difference layer comprises a polymerized unit of a normal dispersion polymerizable liquid crystal compound and a polymerization unit of a reverse dispersion polymerizable liquid crystal compound in a ratio of 5:95 to 10:90 (normal: reverse), the phase difference layer has ultraviolet absorptivity that transmittance for light having a wavelength of 385 nm is 3% or less and transmittance of 2% or more for light having a wavelength of 390 nm, the phase difference layer has an absolute value of a phase difference change ratio according to Equation A below of 17% or less, wherein the normal dispersion polymerizable liquid crystal compound is a compound of Formula 6, and wherein the reverse dispersion polymerizable liquid crystal compound is a compound of Formula 1:

Phase difference change ratio=100×(Ra−Ri)/Ri  [Equation A]

wherein, Ri is the initial in-plane phase difference of the phase difference layer for a wavelength of 550 nm, and Ra is the in-plane phase difference of the phase difference layer for a wavelength of 550 nm after an endurance condition, where the endurance condition is a condition that the phase difference layer is allowed to stand at a temperature of 85° C. for 50 hours or more,

[Formula 6]

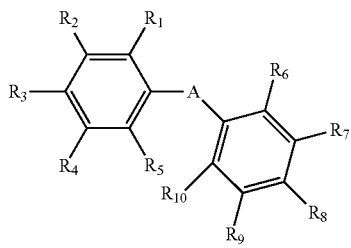

wherein:

A is a single bond, —C(=O)O— or —OC(=O)—;

$R_2$ and $R_3$ or $R_3$ and $R_4$ are bonded to each other to constitute a benzene ring substituted with -L-A-P, where L is —OC(=O)O—, A is an alkylene group and P is an acryloyl group, a methacryloyl group, an acryloyloxy group or a methacryloyloxy group; any one of $R_7$ to $R_9$ is Formula 7 below; the remaining substituents are each independently hydrogen, halogen, an alkyl group, an alkoxy group, an alkoxycarbonyl group, a cyano group or a nitro group;

[Formula 7]

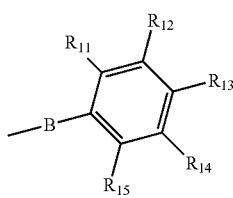

wherein:

B is a single bond, —C(=O)O— or —OC(=O)—; and two neighboring substituents of $R_{11}$ to $R_{15}$ are bonded to each other to constitute a benzene ring substituted with -L-A-P, where L is —OC(=O)O—, A is an alkylene group and P is an acryloyl group, a methacryloyl group, an acryloyloxy group or a methacryloyloxy group; the remaining substituents are each independently hydrogen, halogen, an alkyl group, an alkoxy group, an alkoxycarbonyl group, a cyano group or a nitro group;

[Formula 1]

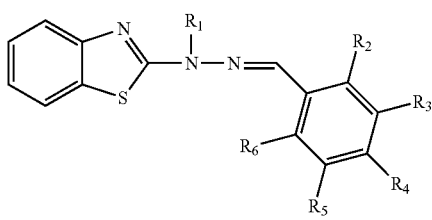

wherein:

$R_1$ is a substituent of Formula 2 or 3 below; and $R_2$ to $R_6$ are each independently hydrogen, an alkyl group, an alkoxy group, a cyano group, a substituent of Formula 4 below or a substituent of Formula 5 below where at least two or more of $R_2$ to $R_6$ are substituents of Formula 4 below or substituents of Formula 5 below:

-$A_1$-$L_1$-Cyc-$A_2$-$L_2$-P  [Formula 2]

wherein:

$A_1$ and $A_2$ are each independently an oxygen atom or a single bond;

$L_1$ and $L_2$ are each independently —C(=O)—O—, —O—C(=O)— or an alkylene group;

Cyc is an arylene group or a cycloalkylene group; and

P is an acryloyl group, a methacryloyl group, an acryloyloxy group or a methacryloyloxy group;

—$L_3$—$\{$O—$L_4\}_n$—P   [Formula 3]

wherein:

$L_3$ and $L_4$ are each an alkylene group;

n is a number in a range of 1 to 4; and

P is an acryloyl group, a methacryloyl group, an acryloyloxy group or a methacryloyloxy group or a hydrogen atom;

-$A_3$-$L_5$-Cyc-$A_4$-$L_6$-P  [Formula 4]

wherein:

$A_3$ and $A_4$ are an oxygen atom, an alkylene group or a single bond;

$L_5$ and $L_6$ are each independently —C(=O)—O—, —O—C(=O)— or an alkylene group;

Cyc is an arylene group; and

P is an acryloyl group, a methacryloyl group, an acryloyloxy group or a methacryloyloxy group;

-$A_5$-$L_7$-$Cy_1$-$A_6$-$L_8$-$Cy_2$-$A_7$-$L_9$-P  [Formula 5]

wherein:

$A_5$, $A_6$ and $A_7$ are each independently an oxygen atom or a single bond;

$L_7$, $L_8$ and $L_9$ are each independently —C(=O)—O—, —O—C(=O)— or an alkylene group;

Cy1 is a cycloalkylene group;

Cy2 is an arylene group; and

P is an acryloyl group, a methacryloyl group, an acryloyloxy group or a methacryloyloxy group.

2. A circularly polarizing plate comprising a polarizer; and a phase difference layer formed on one side of the polarizer, wherein the phase difference layer comprises a polymerized unit of a normal dispersion polymerizable liquid crystal compound and a polymerization unit of a reverse dispersion polymerizable liquid crystal compound in a ratio of 5:95 to 10:90 (normal: reverse), and the phase difference layer has ultraviolet absorptivity that transmittance for light having a wavelength of 385 nm is 3% or less, and transmittance of 2% or more for light having a wavelength of 390 nm, and does not comprise an ultraviolet absorber having a maximum absorption wavelength in a range of 385 nm to 400 nm, wherein the normal dispersion polymerizable liquid crystal compound is a compound of Formula 6, and wherein the reverse dispersion polymerizable liquid crystal compound is a compound of Formula 1:

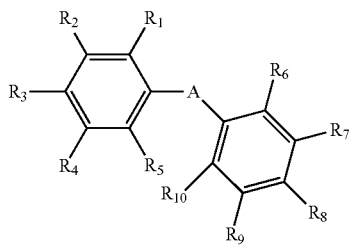

[Formula 6]

wherein:

A is a single bond, —C(=O)O— or —OC(=O)—;

$R_2$ and $R_3$ or $R_3$ and $R_4$ are bonded to each other to constitute a benzene ring substituted with -L-A-P, where L is —OC(=O)O—, A is an alkylene group and P is an acryloyl group, a methacryloyl group, an acryloyloxy group or a methacryloyloxy group; any one of $R_7$ to $R_9$ is Formula 7 below; the remaining substituents are each independently hydrogen, halogen, an alkyl group, an alkoxy group, an alkoxycarbonyl group, a cyano group or a nitro group;

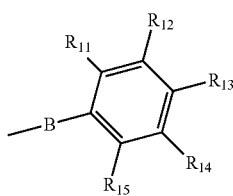

[Formula 7]

wherein:

B is a single bond, —C(=O)O— or —OC(=O)—; and two neighboring substituents of $R_{11}$ to $R_{15}$ are bonded to each other to constitute a benzene ring substituted with -L-A-P, where L is —OC(=O)O—, A is an alkylene group and P is an acryloyl group, a methacryloyl group, an acryloyloxy group or a methacryloyloxy group, and the remaining substituents are each independently hydrogen, halogen, an alkyl group, an alkoxy group, an alkoxycarbonyl group, a cyano group or a nitro group;

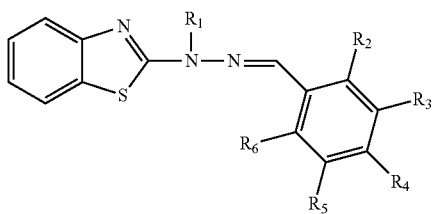

[Formula 1]

wherein:

$R_1$ is a substituent of Formula 2 or 3 below; and $R_2$ to $R_6$ are each independently hydrogen, an alkyl group, an alkoxy group, a cyano group, a substituent of Formula 4 below or a substituent of Formula 5 below where at least two or more of $R_2$ to $R_6$ are substituents of Formula 4 below or substituents of Formula 5 below:

-$A_1$-$L_1$-Cyc-$A_2$-$L_2$-P     [Formula 2]

wherein:

$A_1$ and $A_2$ are each independently an oxygen atom or a single bond;

$L_1$ and $L_2$ are each independently —C(=O)—O—, —O—C(=O)— or an alkylene group;

Cyc is an arylene group or a cycloalkylene group; and

P is an acryloyl group, a methacryloyl group, an acryloyloxy group or a methacryloyloxy group;

$$—L_3—\!\!\left[\!O—L_4\right]_{\!n}\!\!—P$$  [Formula 3]

wherein:

$L_3$ and $L_4$ are each an alkylene group;

n is a number in a range of 1 to 4; and

P is an acryloyl group, a methacryloyl group, an acryloyloxy group or a methacryloyloxy group or a hydrogen atom;

-$A_3$-$L_5$-Cyc-$A_4$-$L_6$-P     [Formula 4]

wherein:

$A_3$ and $A_4$ are an oxygen atom, an alkylene group or a single bond;

$L_5$ and $L_6$ are each independently —C(=O)—O—, —O—C(=O)— or an alkylene group;

Cyc is an arylene group; and

P is an acryloyl group, a methacryloyl group, an acryloyloxy group or a methacryloyloxy group;

-$A_5$-$L_7$-$Cy_1$-$A_6$-$L_8$-$Cy_2$-$A_7$-$L_9$-P     [Formula 5]

wherein:

$A_5$, $A_6$ and $A_7$ are each independently an oxygen atom or a single bond;

$L_7$, $L_8$ and $L_9$ are each independently —C(=O)—O—, —O—C(=O)— or an alkylene group;

Cy1 is a cycloalkylene group;

Cy2 is an arylene group; and

P is an acryloyl group, a methacryloyl group, an acryloyloxy group or a methacryloyloxy group.

3. The circularly polarizing plate according to claim 1, wherein the phase difference layer has a transmittance of 25% or less for light having a wavelength of 395 nm.

4. The circularly polarizing plate according to claim 1, wherein the phase difference layer has a transmittance of 40% or less for light having a wavelength of 400 nm.

5. The circularly polarizing plate according to claim 1, wherein the phase difference layer comprises 40 wt % or more of polymerized units of the reverse wavelength polymerizable liquid crystal compound in polymerized units of the entire polymerizable liquid crystal compound.

6. The circularly polarizing plate according to claim 1, wherein the phase difference layer comprises 30 wt % or more of polymerized units of the polymerizable liquid crystal compound having tri-functionality or more in polymerized units of the entire polymerizable liquid crystal compound.

7. The circularly polarizing plate according to claim 1, further comprising an optical film laminated on an opposite surface of the polarizer facing the phase difference layer and having a planar phase difference for light having a wavelength of 550 nm in a range of 90 nm to 300 nm.

8. The circularly polarizing plate according to claim 1, further comprising an optical film present between the polarizer and the phase difference layer, and having a planar phase difference of 10 nm or less for light having a wavelength of 550 nm and a thickness direction phase difference for light having a wavelength of 550 nm in a range of 40 nm to 400 nm.

9. The circularly polarizing plate according to claim 1, further comprising an optical film present on the lower part of the phase difference layer and having a thickness direction phase difference in a range of 10 to 400 nm.

10. An organic light emitting display device, comprising:
a reflective electrode;
a transparent electrode;
an organic layer interposed between the reflective electrode and the transparent electrode and having a light emitting layer; and
the circularly polarizing plate of claim 1,
wherein:
the circularly polarizing plate is present outside the reflective or transparent electrode, and
the phase difference layer is disposed closer to the reflective or transparent electrode than the polarizer.

11. An organic light emitting display device, comprising:
a reflective electrode;
a transparent electrode;
an organic layer interposed between the reflective electrode and the transparent electrode and having a light emitting layer; and
the circularly polarizing plate of claim 2,
wherein:
the circularly polarizing plate is present outside the reflective or transparent electrode, and
the phase difference layer is disposed closer to the reflective or transparent electrode than the polarizer.

12. The circularly polarizing plate according to claim 2, wherein the phase difference layer has a transmittance of 25% or less for light having a wavelength of 395 nm.

13. The circularly polarizing plate according to claim 2, wherein the phase difference layer has a transmittance of 40% or less for light having a wavelength of 400 nm.

14. The circularly polarizing plate according to claim 2, further comprising an optical film laminated on an opposite surface of the polarizer facing the phase difference layer and having a planar phase difference for light having a wavelength of 550 nm in a range of 90 nm to 300 nm.

15. The circularly polarizing plate according to claim 2, further comprising an optical film present between the polarizer and the phase difference layer, and having a planar phase difference of 10 nm or less for light having a wavelength of 550 nm and a thickness direction phase difference for light having a wavelength of 550 nm in a range of 40 nm to 400 nm.

16. The circularly polarizing plate according to claim 2, further comprising an optical film present on the lower part of the phase difference layer and having a thickness direction phase difference in a range of 10 to 400 nm.

* * * * *